United States Patent
Yamamoto et al.

(10) Patent No.: US 12,456,961 B2
(45) Date of Patent: Oct. 28, 2025

(54) ACOUSTIC WAVE DEVICE AND WAFER WITH SUPPORT SUBSTRATE HAVING AN UNEVEN SURFACE, AND MANUFACTURING METHOD OF WAFER

(71) Applicant: TAIYO YUDEN CO., LTD., Tokyo (JP)

(72) Inventors: Shinji Yamamoto, Tokyo (JP); Michio Miura, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 1094 days.

(21) Appl. No.: 17/462,543

(22) Filed: Aug. 31, 2021

(65) Prior Publication Data

US 2022/0094330 A1   Mar. 24, 2022

(30) Foreign Application Priority Data

Sep. 23, 2020   (JP) ................. 2020-158550

(51) Int. Cl.
| | |
|---|---|
| *H03H 3/02* | (2006.01) |
| *H03H 9/02* | (2006.01) |
| *H03H 9/13* | (2006.01) |
| *H03H 9/17* | (2006.01) |

(52) U.S. Cl.
CPC ............ *H03H 9/173* (2013.01); *H03H 3/02* (2013.01); *H03H 9/02015* (2013.01); *H03H 9/02157* (2013.01); *H03H 9/131* (2013.01); *H03H 9/132* (2013.01)

(58) Field of Classification Search
CPC .......... H03H 3/02; H03H 9/131; H03H 9/132; H03H 9/173; H03H 9/02015; H03H 9/02157
USPC ........................................... 310/349
See application file for complete search history.

(56) References Cited

U.S. PATENT DOCUMENTS

| | | | |
|---|---|---|---|
| 2016/0332864 A1* | 11/2016 | Iihola | B81B 3/0094 |
| 2017/0244381 A1* | 8/2017 | Lee | H03H 9/173 |
| 2019/0288661 A1 | 9/2019 | Akiyama et al. | H03H 9/02614 |
| 2020/0389148 A1 | 12/2020 | Vo et al. | H03H 9/02866 |

FOREIGN PATENT DOCUMENTS

| | | |
|---|---|---|
| JP | 2018-061258 A | 4/2018 |
| JP | 2020-510354 A | 4/2020 |

* cited by examiner

*Primary Examiner* — Emily P Pham
*Assistant Examiner* — Monica Mata
(74) *Attorney, Agent, or Firm* — Stein IP, LLC

(57) ABSTRACT

An acoustic wave device includes a support substrate having an uneven surface, a piezoelectric layer provided on the uneven surface of the support substrate, an electrode that excites an acoustic wave in the piezoelectric layer, and an insulating layer that is provided between the uneven surface of the support substrate and the piezoelectric layer, and has an air gap located in a recess part of the uneven surface.

13 Claims, 17 Drawing Sheets

ACOUSTIC WAVE DEVICE AND WAFER WITH SUPPORT SUBSTRATE HAVING AN UNEVEN SURFACE, AND MANUFACTURING METHOD OF WAFER

CROSS-REFERENCE TO RELATED APPLICATION

This application is based upon and claims the benefit of priority of the prior Japanese Patent Application No. 2020-158550, filed on Sep. 23, 2020, the entire contents of which are incorporated herein by reference.

FIELD

A certain aspect of the present embodiments relates to an acoustic wave device, a wafer, and a manufacturing method of a wafer.

BACKGROUND

Acoustic wave elements such as surface acoustic wave resonators are used in communication devices such as smartphones. It is known to attach a piezoelectric layer, which forms the acoustic wave element, to a support substrate. It is known to roughen the top surface of the support substrate as disclosed in, for example, Japanese Patent Application Publication No. 2018-061258. It is known to provide a layer having a hollow space between the support substrate and the piezoelectric layer as disclosed in Japanese Patent Application Publication No. 2020-510354.

SUMMARY

Spurious emissions can be reduced by roughening the top surface of the support substrate. Spurious emissions can be also reduced by providing the layer having a hollow space between the support substrate and the piezoelectric layer. However, there is room for improvement in reducing spurious emissions while reducing the deterioration in the main response.

According to a first aspect of the present disclosure, there is provided an acoustic wave device including a support substrate having an uneven surface; a piezoelectric layer provided on the uneven surface of the support substrate; an electrode that excites an acoustic wave in the piezoelectric layer; and an insulating layer that is provided between the uneven surface of the support substrate and the piezoelectric layer, and has an air gap located in a recess part of the uneven surface.

According to a second aspect of the present embodiments, there is provided a wafer including: a support substrate having an uneven surface; a piezoelectric layer provided on the uneven surface of the support substrate; and an insulating layer that is provided between the uneven surface of the support substrate and the piezoelectric layer, and has an air gap located in a recess part of the uneven surface.

According to a third aspect of the present embodiments, there is provided a manufacturing method of a wafer, including: preparing a support substrate having an uneven surface; forming an insulating layer on the uneven surface of the support substrate so that an air gap located in a recess part of the uneven surface is formed in the insulating layer through formation of the insulating layer on the uneven surface of the support substrate; and forming a piezoelectric layer on the insulating layer.

DETAILED DESCRIPTION

Hereinafter, embodiments of the present disclosure will be described with reference to the accompanying drawings.

First Embodiment

Figure 1:
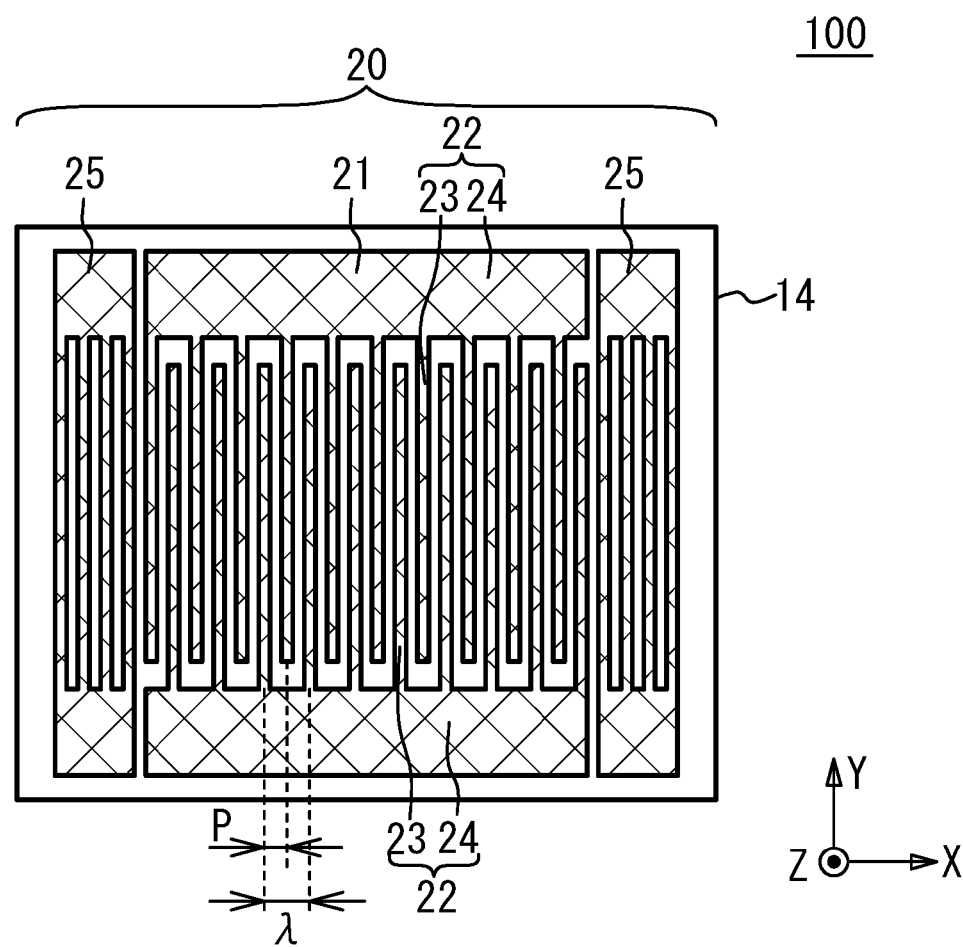
FIG. 1 is a plan view of an acoustic wave device in accordance with a first embodiment.
Figure 2:
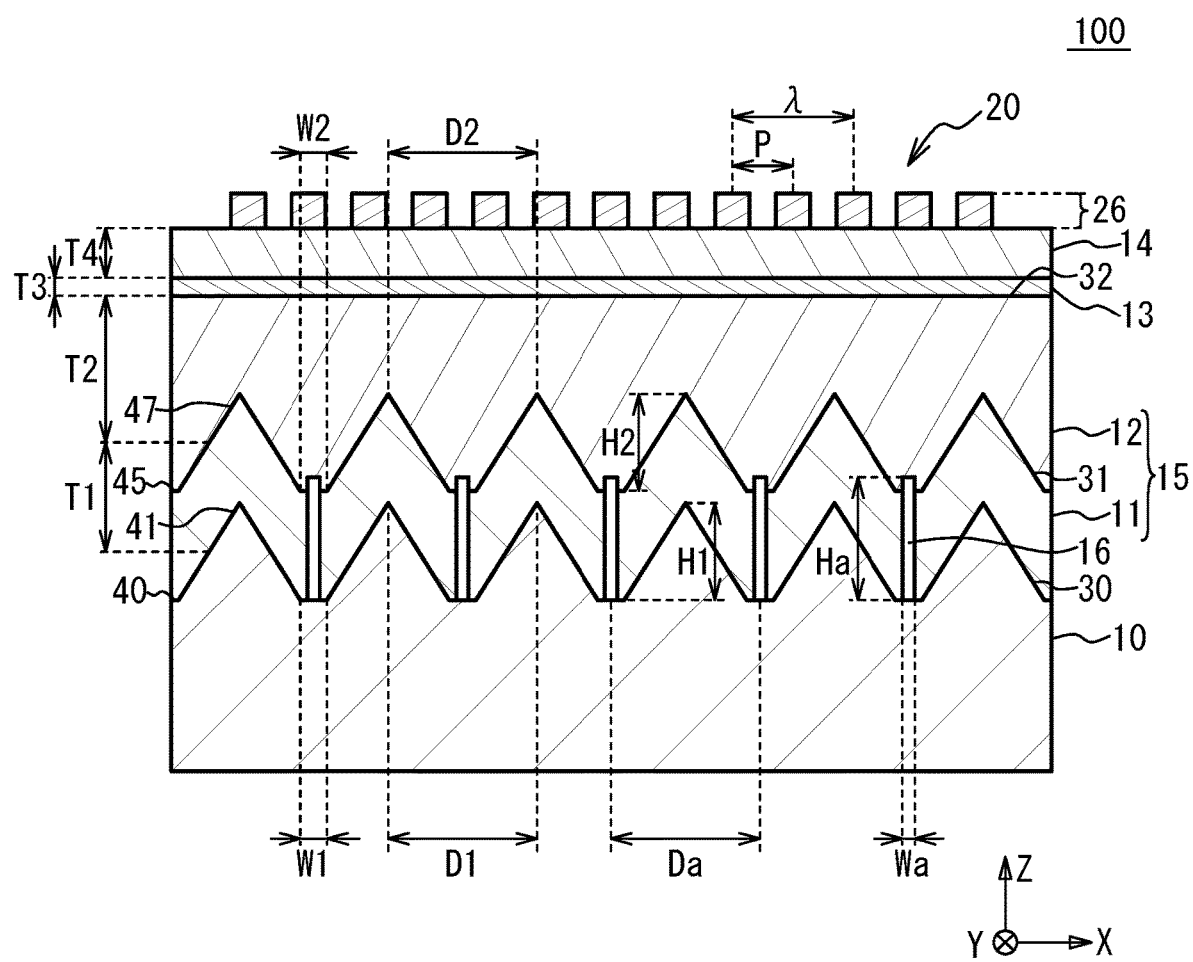
FIG. 2 is a cross-sectional view of the acoustic wave device in accordance with the first embodiment.

FIG. 1 is a plan view of an acoustic wave device in accordance with a first embodiment. FIG. 2 is a cross-sectional view of the acoustic wave device in accordance with the first embodiment. The direction in which electrode fingers are arranged (the arrangement direction of the electrode fingers) is defined as an X direction, the direction in which the electrode fingers extend (the extension direction of the electrode fingers) is defined as a Y direction, and the direction in which a support substrate and a piezoelectric layer are stacked (the stack direction) is defined as a Z direction. The X direction, the Y direction, and the Z direction do not necessarily correspond to the X-axis orientation, the Y-axis orientation, and the Z-axis orientation of the crystal orientation of the piezoelectric layer. When the piezoelectric layer is a rotated Y-cut X-propagation substrate, the X direction is the X-axis orientation of the crystal orientation.

As illustrated in FIG. 1 and FIG. 2, an acoustic wave device 100 of the first embodiment includes a piezoelectric layer 14 provided over a support substrate 10. An insulating layer 15 is provided between the support substrate 10 and the piezoelectric layer 14. The insulating layer 15 includes a boundary layer 11 and a temperature compensation layer 12. The boundary layer 11 is provided between the support substrate 10 and the temperature compensation layer 12, and the temperature compensation layer 12 is provided between the boundary layer 11 and the piezoelectric layer 14. A bonding layer 13 is provided between the temperature compensation layer 12 and the piezoelectric layer 14, but the bonding layer 13 may be omitted. A first surface, which is closer to the boundary layer 11, of the support substrate 10 is defined as a surface 30. A first surface, which is closer to the temperature compensation layer 12, of the boundary layer 11 is defined as a surface 31. A first surface, which is closer to the piezoelectric layer 14, of the temperature compensation layer 12 is defined as a surface 32.

The surface 30 of the support substrate 10 corresponds to the boundary face between the support substrate 10 and the boundary layer 11, and is an uneven surface. The surface 31 of the boundary layer 11 corresponds to the boundary face between the boundary layer 11 and the temperature compensation layer 12, and is an uneven surface. The surface 32 of the temperature compensation layer 12 corresponds to the boundary face between the temperature compensation layer 12 and the bonding layer 13 or the boundary face between the temperature compensation layer 12 and the piezoelectric layer 14, and is a flat surface. The unevenness of the surface 30 corresponds to the unevenness of the surface 31. A plurality of protruding portions 41 provided on a planar surface 40 makes the surface 30 uneven. The protruding portions 41 are regularly arranged. Similarly, a plurality of protruding portions 47 provided on a planar surface 45 makes the surface 31 uneven. The protruding portions 47 are regularly arranged so as to correspond to the protruding portions 41.

Air gaps (slits) 16, which are located between the protruding portions 41 and start from respective recess parts of the uneven surface, are provided in the insulating layer 15. The air gap 16 extends from the boundary layer 11 to a part of the temperature compensation layer 12 in the Z direction. The shape of the air gap 16 is not limited to a rectangular shape in a cross-sectional view, and may be a tapered shape that becomes thinner toward the end closer to the temperature compensation layer 12.

The height of the air gap 16 is represented by Ha, the width of the air gap 16 is represented by Wa, and the regular interval between the air gaps 16 is represented by Da. The width Wa of the air gap 16 is the length that is largest in the short direction when the air gap 16 is viewed in a plan view. The regular interval between the protruding portions 41 is represented by D1, and the regular interval between the protruding portions 47 is represented by D2. The height of the unevenness of the surface 30 is represented by H1, and the height of the unevenness of the surface 31 is represented by H2. The distance between the protruding portions 41 is represented by W1, and the distance between the protruding portions 47 is represented by W2.

The height Ha of the air gap 16 is, for example, equal to or greater than 0.2 times the average height of the uneven-ness of the surface 30 of the support substrate 10, and is, for example, 0.1λ to 1.0λ. The average height of the unevenness of the surface 30 may be the average value of the heights H of all the protruding portions 41, or may be the average value of the heights H of ¼ or ⅙ of all the protruding portions 41. The average value may be the arithmetic average. Alternatively, the average height of the surface 30 may be obtained as follows. The cross-section of the acoustic wave device is observed, and the heights H1 of several (for example, about five) protruding portions 41 located next to the air gaps 16 are measured. The arithmetic average of the measured heights may be used as the average height of the surface 30. The width Wa of the air gap 16 is, for example, equal to or greater than 0.01 times the regular interval D1 between the protruding portions 41 and equal to or less than 0.2 times the regular interval D1 between the protruding portions 41, and is, for example, 0.005λ to 0.2λ. The average period of the unevenness of the surface 30 may be the average value of the regular intervals D1 between respective two of all the protruding portions 41, or may be the average value of the regular intervals D1 between respective two of ½ or ⅓ of all the protruding portions 41. The average value may be the arithmetic average. Alternatively, the average period of the unevenness of the surface 30 may be obtained as follows. The cross-section of the acoustic wave device is observed, and the regular intervals D1 between respective two of several (for example, about five) protruding portions 41 located next to the air gaps 16 are measured. The arithmetic average of the measured regular intervals D1 may be used as the average period of the unevenness of the surface 30.

The regular interval D1 between the protruding portions 41 is substantially equal to the regular interval D2 between the protruding portions 47, and the regular interval Da between the air gaps 16 is substantially equal to the regular interval D1 between the protruding portions 41 and the regular interval D2 between the protruding portions 47. The height H1 of the unevenness of the surface 30 is substantially equal to the height H2 of the unevenness of the surface 31. The positions of the protruding portions 41 are substantially the same as the positions of the protruding portions 47, and the phase of the unevenness of the surface 30 is substantially equal to the phase of the unevenness of the surface 31. The terms "substantially equal to" and "substantially the same" mean that an error of about the manufacturing error is acceptable, and for example, an error of 10% or less, or an error of 1% or less is acceptable. The same applies hereinafter. The thickness of the boundary layer 11 is represented by T1, the thickness of the temperature compensation layer 12 is represented by T2, the thickness of the bonding layer 13 is represented by T3, and the thickness of the piezoelectric layer 14 is represented by T4. Since the thickness of the boundary layer 11 and the thickness of the temperature compensation layer 12 are not uniform, the thicknesses T1 and T2 are the average thicknesses.

An acoustic wave element 20 is disposed on the piezoelectric layer 14. The acoustic wave element 20 is, for example, a surface acoustic wave resonator, and includes an IDT 21 and reflectors 25. The reflectors 25 are located at both sides of the IDT 21 in the X direction. The IDT 21 and the reflectors 25 are formed of a metal film 26 on the piezoelectric layer 14.

The IDT 21 includes a pair of comb-shaped electrodes 22 opposite to each other. The comb-shaped electrode 22 includes a plurality of electrode fingers 23, and a bus bar 24 to which the electrode fingers 23 are coupled. The comb-shaped electrodes 22 are opposite to each other so that the electrode fingers 23 of one of the comb-shaped electrodes 22 and the electrode fingers 23 of the other of the comb-shaped electrodes 22 are substantially alternately arranged in at least a part of the IDT 21. The acoustic wave excited in the piezoelectric layer 14 by the electrode fingers 23 propagates mainly in the X direction. The pitch of the electrode fingers 23 of one of the comb-shaped electrodes 22 is approximately equal to the wavelength λ of the acoustic wave. When the pitch of the electrode fingers 23 is represented by P, the pitch of the electrode fingers 23 of one of the comb-shaped electrodes 22 is equal to two times the pitch P of the electrode fingers 23. The reflectors 25 reflect the acoustic wave (the surface acoustic wave) excited by the electrode fingers 23.

The piezoelectric layer 14 is, for example, a monocrystalline lithium tantalate ($LiTaO_3$) layer or a monocrystalline lithium niobate ($LiNbO_3$) layer, and is, for example, a rotated Y-cut X-propagation lithium tantalate layer or a rotated Y-cut X-propagation lithium niobate layer.

The support substrate 10 is, for example, a sapphire substrate, a silicon substrate, a spinel substrate, a quartz substrate, a crystal substrate, an alumina substrate, or a silicon carbide substrate. The sapphire substrate is a monocrystalline $Al_2O_3$ substrate, the silicon substrate is a monocrystalline or polycrystalline silicon substrate, the spinel substrate is a polycrystalline $MgAl_2O_4$ substrate, the quartz substrate is an amorphous $SiO_2$ substrate, the crystal substrate is a monocrystalline $SiO_2$ substrate, the alumina substrate is a polycrystalline or amorphous $Al_2O_3$ substrate, and the silicon carbide substrate is a monocrystalline or polycrystalline SiC substrate. The linear expansion coefficient in the X direction of the support substrate 10 is less than the linear expansion coefficient in the X direction of the piezoelectric layer 14. This reduces the frequency temperature dependence of the acoustic wave element.

The temperature compensation layer 12 has a temperature coefficient of an elastic constant opposite in sign to the temperature coefficient of the elastic constant of the piezoelectric layer 14. For example, the piezoelectric layer 14 has a negative temperature coefficient of an elastic constant, while the temperature compensation layer 12 has a positive temperature coefficient of an elastic constant. The temperature compensation layer 12 is, for example, an additive-free silicon oxide ($SiO_2$) layer or a $SiO_2$ layer containing additive elements such as fluorine, and is, for example, an amorphous layer. This reduces the temperature coefficient of frequency of the acoustic wave element. When the temperature compensation layer 12 is a silicon oxide layer, the acoustic velocity of the bulk wave propagating through the temperature compensation layer 12 is lower than the acoustic velocity of the bulk wave propagating through the piezoelectric layer 14.

To allow the temperature compensation layer 12 to have a temperature compensation function, the energy of the surface acoustic wave that is excited in the piezoelectric layer 14 by the IDT 21 and used as the primary mode is required to exist in the temperature compensation layer 12 to some extent. The section where the energy of the surface acoustic wave exists depends on the type of the surface acoustic wave, and is typically from the upper surface of the piezoelectric layer 14 to a depth of approximately 2λ. In particular, the energy of the surface acoustic wave is concentrated in the section from the upper surface of the piezoelectric layer 14 to a depth of λ. Therefore, the thickness T4 of the piezoelectric layer 14 is preferably λ or less.

The IDT 21 also excites a bulk wave when exciting the surface acoustic wave used as the primary mode. The bulk wave exists from the upper surface of the piezoelectric layer 14 to a depth of 10λ or greater. As the bulk wave propagates downward, the energy of the acoustic wave excited by the IDT 21 leaks, and the loss increases. On the other hand, when the bulk wave is reflected by the boundary faces between the layers from the piezoelectric layer 14 to the support substrate 10 and returns to the IDT 21, the returned bulk wave causes spurious emissions.

The acoustic velocity of the bulk wave propagating through the boundary layer 11 is different from the acoustic velocity of the bulk wave propagating through the temperature compensation layer 12, and the acoustic velocity of the bulk wave propagating through the support substrate 10 is different from the acoustic velocity of the bulk wave propagating through the boundary layer 11. This allows the bulk wave to be scattered by the unevenness of the surfaces 30 and 31, thereby reducing spurious emissions. The acoustic velocity of the bulk wave propagating through the boundary layer 11 and the acoustic velocity of the bulk wave propagating through the temperature compensation layer 12 are preferably different from each other by 1.2 times or greater, and the acoustic velocity of the bulk wave propagating through the support substrate 10 and the acoustic velocity of the bulk wave propagating through the boundary layer 11 are preferably different from each other by 1.2 times or greater.

The acoustic velocity of the bulk wave propagating through the boundary layer 11 is preferably higher than the acoustic velocity of the bulk wave propagating through the temperature compensation layer 12. This causes the acoustic wave to be more likely to be confined in the piezoelectric layer 14 and the temperature compensation layer 12. The acoustic velocity of the bulk wave propagating through the boundary layer 11 is preferably equal to or greater than 1.1 times, more preferably equal to or greater than 1.2 times the acoustic velocity of the bulk wave propagating through the temperature compensation layer 12. Too high acoustic velocity of the bulk wave propagating through the boundary layer 11 causes the bulk wave to be more likely to be reflected by the boundary face between the boundary layer 11 and the temperature compensation layer 12, and spurious emissions may thereby increase. Therefore, the acoustic velocity of the bulk wave propagating through the boundary layer 11 is preferably equal to or less than 2.0 times, more preferably equal to or less than 1.5 times the acoustic velocity of the bulk wave propagating through the temperature compensation layer 12. The boundary layer 11 is, for example, polycrystalline or amorphous, and is, for example, an aluminum oxide layer, a silicon layer, an aluminum nitride layer, a silicon nitride layer, or a silicon carbide layer. A plurality of layers made of different materials may be provided as the boundary layer 11. The thickness T1 of the boundary layer 11 is, for example, equal to or greater than 0.5 times the average height of the unevenness of the surface 30 and equal to or less than 2.0 times the average height of the unevenness of the surface 30.

The acoustic velocity of the bulk wave propagating through the support substrate 10 is preferably higher than the acoustic velocity of the bulk wave propagating through the boundary layer 11, and is preferably equal to or greater than 1.1 times, more preferably equal to or greater than 1.2 times the acoustic velocity of the bulk wave propagating through the boundary layer 11. The acoustic velocity of the bulk wave propagating through the support substrate 10 is preferably equal to or less than 2.0 times the acoustic velocity of the bulk wave propagating through the boundary layer 11.

The acoustic velocity of the bulk wave propagating through the temperature compensation layer 12 may be higher than the acoustic velocity of the bulk wave propagating through the piezoelectric layer 14. However, the acoustic velocity of the bulk wave propagating through the temperature compensation layer 12 is preferably lower than the acoustic velocity of the bulk wave propagating through the piezoelectric layer 14 because the acoustic wave is more likely to exist in the temperature compensation layer 12. The acoustic velocity of the bulk wave propagating through the temperature compensation layer 12 is preferably equal to or less than 0.99 times the acoustic velocity of the bulk wave propagating through the piezoelectric layer 14. Too low acoustic velocity of the bulk wave propagating through the temperature compensation layer 12 causes the acoustic wave to be less likely to exist in the piezoelectric layer 14. Therefore, the acoustic velocity of the bulk wave propagating through the temperature compensation layer 12 is preferably equal to or greater than 0.9 times the acoustic velocity of the bulk wave propagating through the piezoelectric layer 14.

The acoustic velocity of the bulk wave propagating through the bonding layer 13 is preferably higher than the acoustic velocity of the bulk wave propagating through the temperature compensation layer 12. The bonding layer 13 is, for example, polycrystalline or amorphous, and is, for example, an aluminum oxide layer, a silicon layer, an aluminum nitride layer, a silicon nitride layer, a diamond-like carbon layer, or a silicon carbide layer. In addition, the acoustic velocity of the bulk wave propagating through the boundary layer 11 and the acoustic velocity of the bulk wave propagating through the bonding layer 13 are preferably higher than the acoustic velocity of the bulk wave propagating through the piezoelectric layer 14.

The metal film 26 is a film mainly composed of, for example, aluminum, copper, or molybdenum. An adhesion film such as a titanium film or a chrome film may be provided between the electrode finger 23 and the piezoelectric layer 14. The adhesion film is thinner than the electrode finger 23. An insulating film may be provided so as to cover the electrode fingers 23. The insulating film serves as a protective film and/or a temperature compensation film.

The wavelength $\lambda$, of the acoustic wave is, for example, 1 μm to 6 μm. When two electrode fingers 23 are defined as a pair, the number of pairs of the electrode fingers 23 is, for example, 20 pairs to 300 pairs. The duty ratio of the IDT 21 is calculated by dividing the width of the electrode finger 23 by the pitch of the electrode fingers 23, and is, for example, 30% to 70%. The aperture length of the IDT 21 is, for example, 10$\lambda$, to 50$\lambda$.

Manufacturing Method

FIG. 3A to FIG. 4C are cross-sectional views illustrating a method of manufacturing the acoustic wave device in accordance with the first embodiment. The manufacturing method illustrated in FIG. 3A to FIG. 4C is performed in a wafer state, and, finally, the wafer is separated into individual chips to form the acoustic wave device of the first embodiment. The acoustic wave devices are formed on a wafer, but only one acoustic wave device is illustrated in FIG. 3A to FIG. 4C.

Figure 3A:
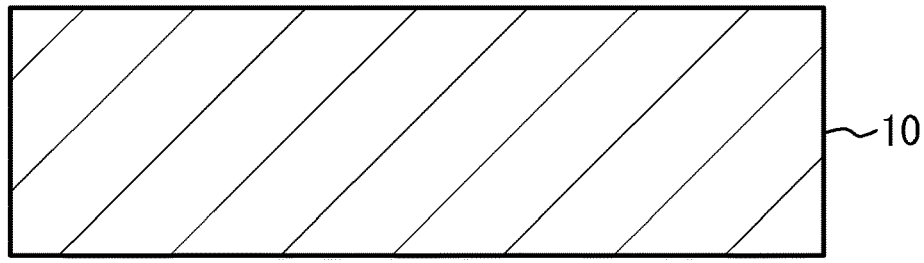
FIG. 3A to FIG. 3D are cross-sectional views (No. 1) illustrating a method of manufacturing the acoustic wave device in accordance with the first embodiment.

As illustrated in FIG. 3A, the support substrate 10 in a wafer state having a flat surface is prepared. The arithmetic mean roughness Ra of the surface of the support substrate 10 is, for example, 1 nm or less.

Figure 3B:
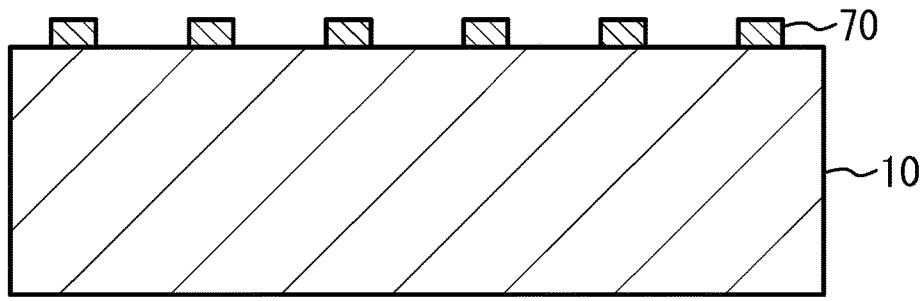

As illustrated in FIG. 3B, a mask layer 70 having apertures is formed on the support substrate 10. The mask layer 70 is, for example, a photoresist.

Figure 3C:
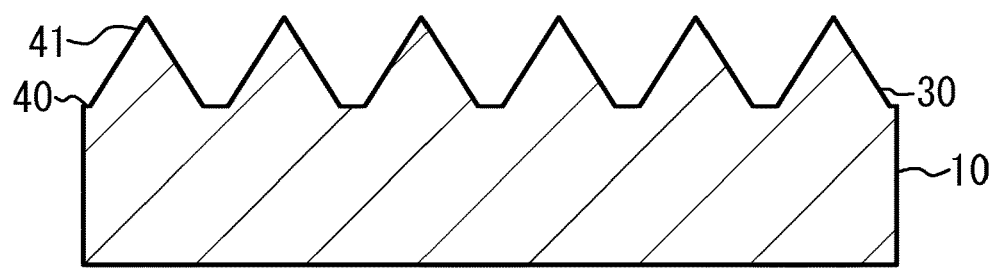

As illustrated in FIG. 3C, the upper part of the support substrate 10 is removed using the mask layer 70 as a mask. This causes the surface 30 of the support substrate 10 to be an uneven surface having the protruding portions 41 provided on the planar surface 40. The upper part of the support substrate 10 is removed by, for example, etching or sandblasting. For example, when the support substrate 10 is a sapphire substrate, the upper part of the support substrate 10 is removed by dry etching using chlorine-based gas. The etching liquid and the etching gas are appropriately selected depending on the material of the support substrate 10.

Figure 3D:
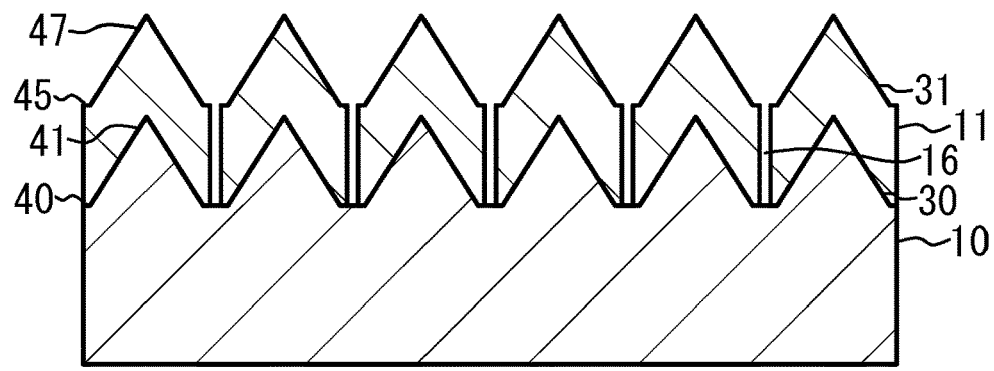

As illustrated in FIG. 3D, the boundary layer 11 is formed on the surface 30 of the support substrate 10 by sputtering. The film formation by sputtering does not have good coverage on uneven surfaces. Thus, the air gap 16 starting from the recess part between the protruding portions 41 is formed in the boundary layer 11 by appropriately setting the film forming condition for sputtering. In addition, the unevenness of the surface 30 of the support substrate 10 is reflected in the surface 31 of the boundary layer 11, and the surface 31 of the boundary layer 11 becomes an uneven surface having the protruding portions 47 provided on the planar surface 45. The formation method of the boundary layer 11 is not limited to sputtering, and other methods may be used as long as the air gap 16 located in the recess part between the protruding portions 41 can be formed.

Figure 4A:
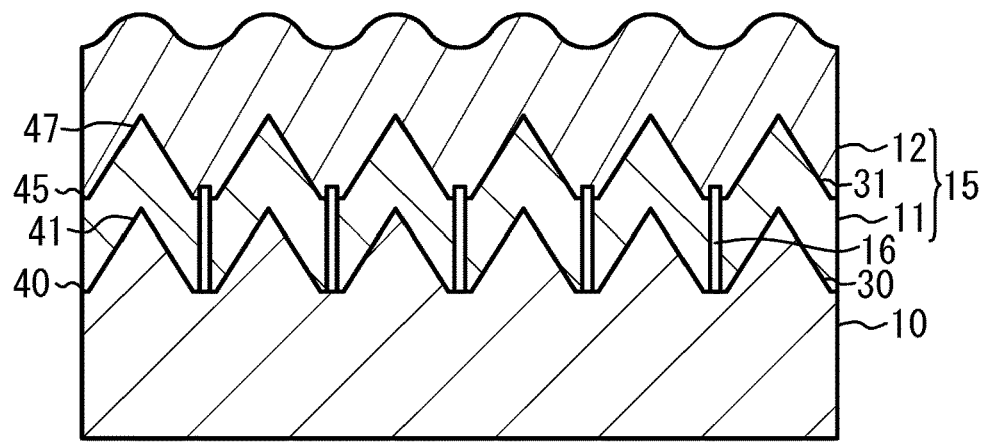
FIG. 4A to FIG. 4C are cross-sectional views (No. 2) illustrating the method of manufacturing the acoustic wave device in accordance with the first embodiment.

As illustrated in FIG. 4A, the temperature compensation layer 12 is formed on the surface 31 of the boundary layer 11 by chemical vapor deposition (CVD). The film formation by CVD has good coverage on uneven surfaces compared with the film formation by sputtering. Thus, the temperature compensation layer 12 is likely to be embedded in the recess part between the protruding portions 47.

Figure 4B:
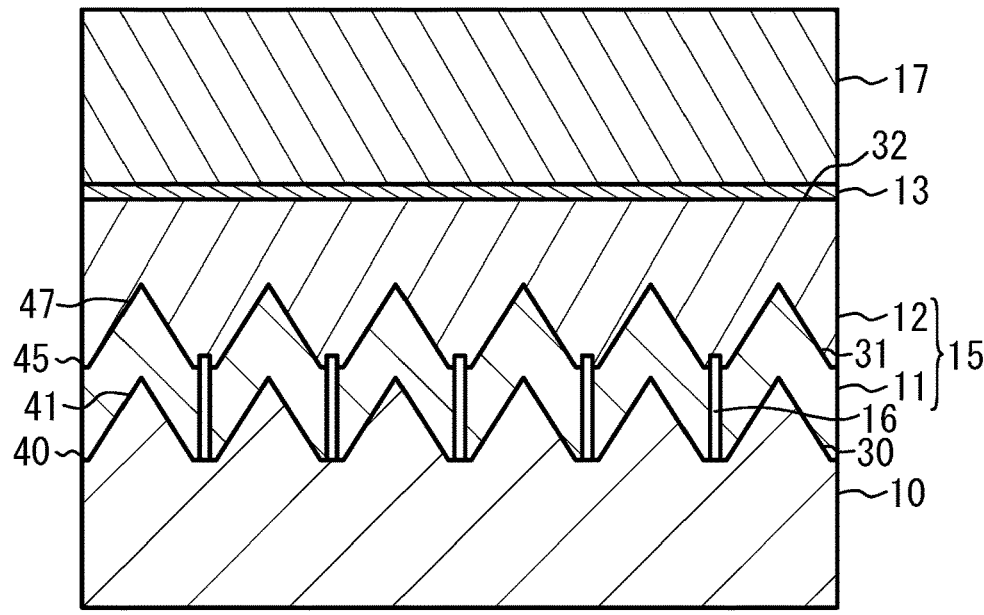

As illustrated in FIG. 4B, the upper surface of the temperature compensation layer 12 is planarized by, for example, chemical mechanical polishing (CMP). Thereafter, a piezoelectric substrate 17 is bonded to the upper surface of the temperature compensation layer 12 through the bonding layer 13. The temperature compensation layer 12 and the piezoelectric substrate 17 may be bonded to each other without the bonding layer 13. The surface activation method is used for bonding, for example.

Figure 4C:
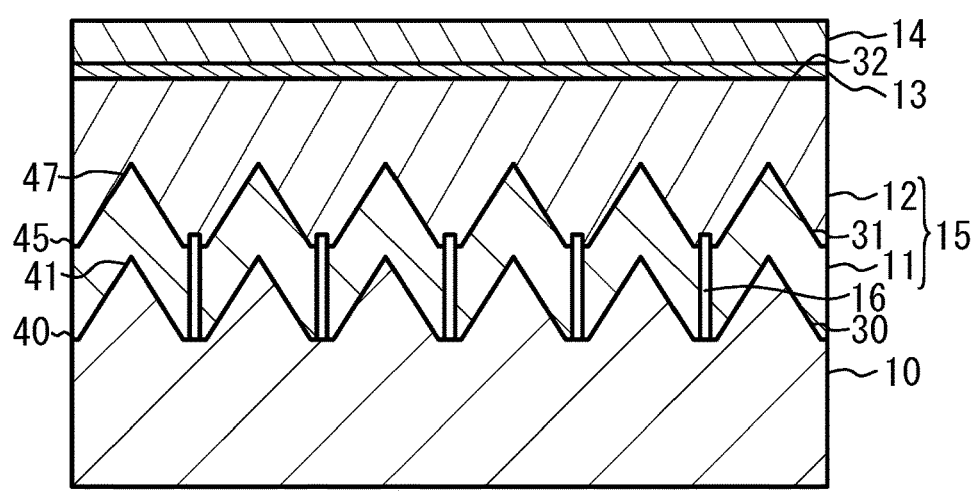

As illustrated in FIG. 4C, the upper surface of the piezoelectric substrate 17 is planarized using, for example, CMP to form the thinned piezoelectric layer 14. Thereafter, as illustrated in FIG. 2, the acoustic wave element 20 formed of the metal film 26 is formed on the upper surface of the piezoelectric layer 14. Finally, the wafer is separated into individual chips to form the acoustic wave device 100 in accordance with the first embodiment.

Experiment and Simulation

An experiment for evaluating spurious emissions was conducted for the acoustic wave device in accordance with the first embodiment. In addition, a simulation for evaluating spurious emissions was performed for an acoustic wave device in accordance with a comparative example.

Figure 5:
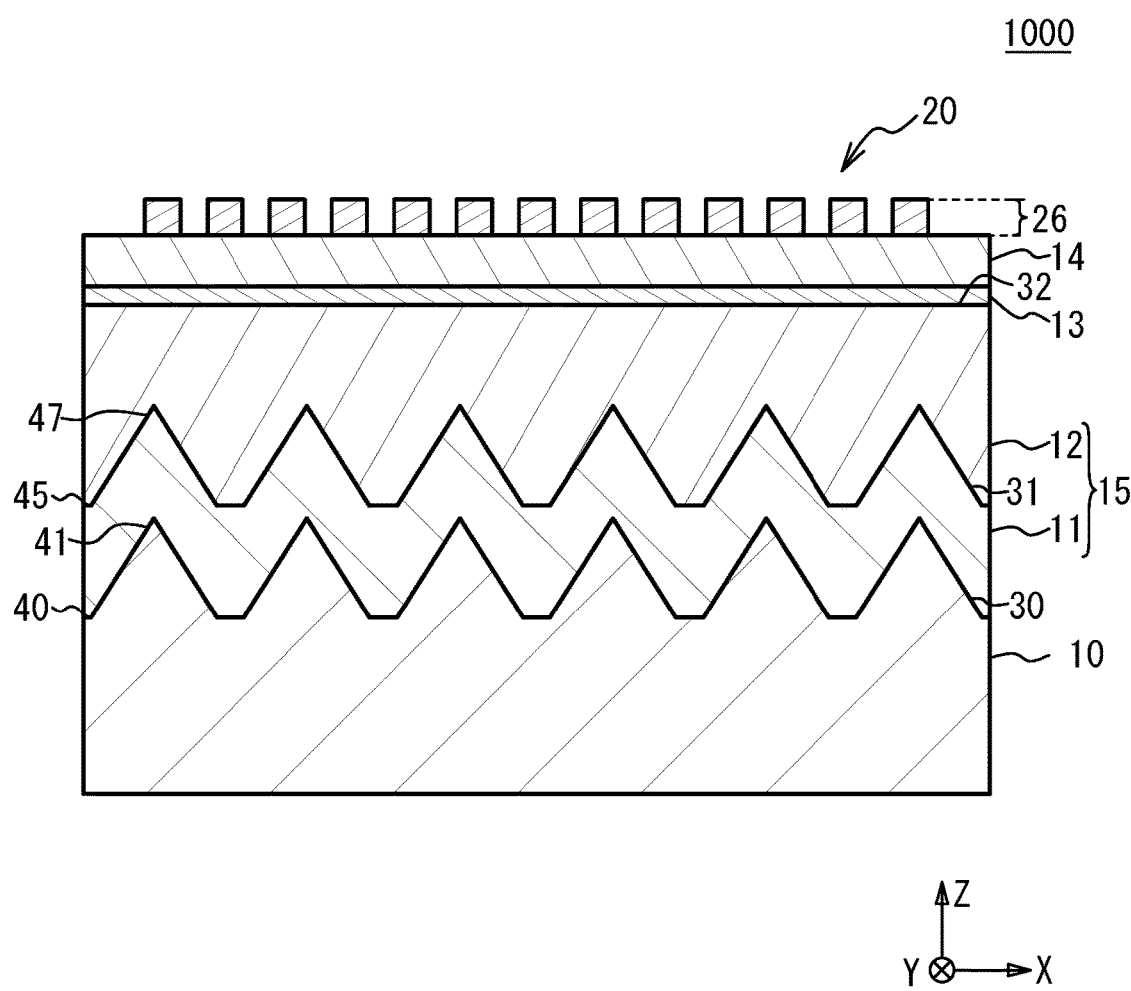
FIG. 5 is a cross-sectional view of an acoustic wave device in accordance with a comparative example.

FIG. 5 is a cross-sectional view of the acoustic wave device in accordance with the comparative example. As illustrated in FIG. 5, in an acoustic wave device 1000 of the comparative example, no air gap 16 is provided in the insulating layer 15. Other structures are the same as those of the first embodiment, and the description thereof is thus omitted.

The experiment condition and the simulation condition are as follows.

Wavelength $\lambda$, of the acoustic wave: 5 μm

Support substrate 10: Sapphire substrate

Boundary layer 11: Aluminum oxide layer with a thickness T1 of 0.3$\lambda$

Temperature compensation layer 12: Silicon oxide layer with a thickness T2 of 0.4λ

Bonding layer 13: not provided

Piezoelectric layer 14: Rotated Y-cut X-propagation lithium tantalate layer with a thickness T4 of 0.4λ

Metal film 26: Aluminum film with a thickness of 0.1λ

Heights H1 and H2 of unevenness: 0.5λ

Regular interval D1 between the protruding portions 41 and the regular interval D2 between the protruding portions 47: 0.8λ

Distance W1 between the protruding portions 41 and the distance W2 between the protruding portions 47: 0.02λ

Height Ha of the air gap 16: 0.4λ

Distance Wa between the air gaps 16: 0.015λ

Regular interval Da between the air gaps 16: 0.8λ

Figure 6:
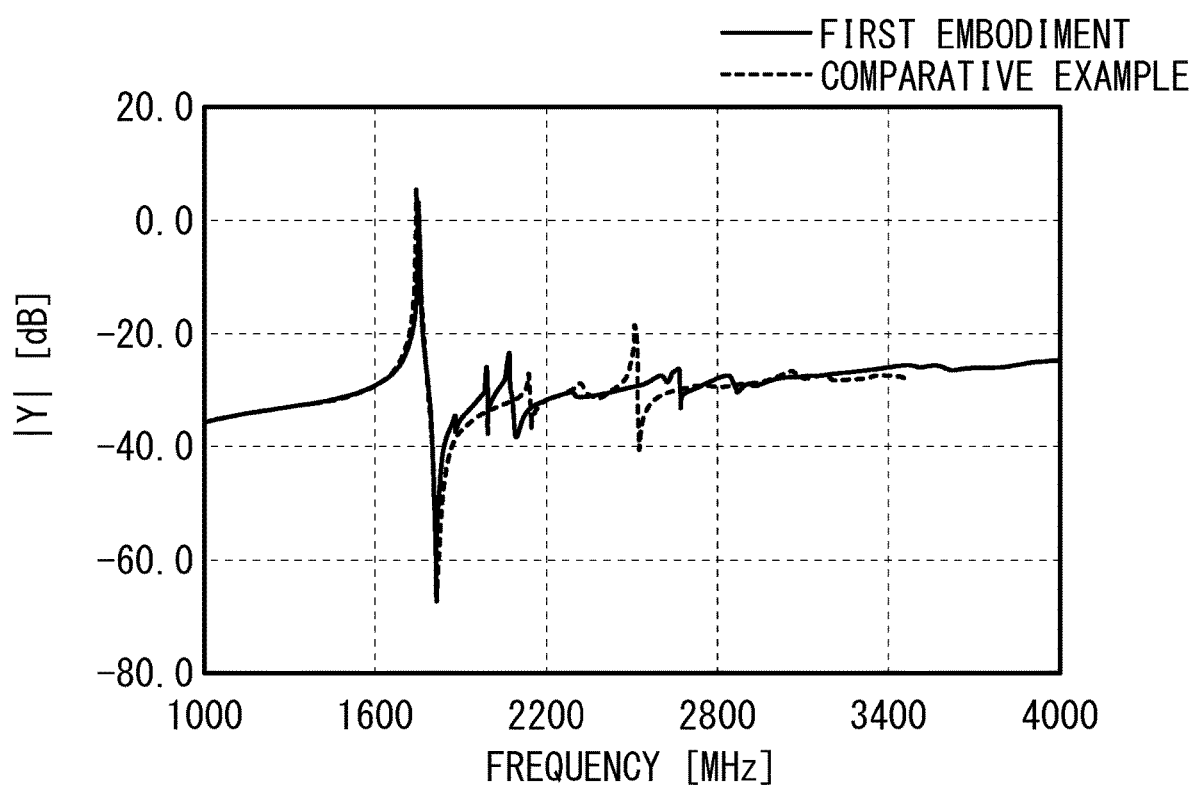
FIG. 6 is a graph of admittance |Y| versus frequency in the acoustic wave device of the first embodiment and the acoustic wave device of the comparative example.

FIG. 6 is a graph of admittance |Y| versus frequency in the acoustic wave device in accordance with the first embodiment and the acoustic wave device in accordance with the comparative example. As illustrated in FIG. 6, the main response formed by the surface acoustic wave used as the primary mode is little different between the first embodiment and the comparative example. On the other hand, the magnitude of the spurious response of the first embodiment is less than that of the comparative example.

The reason why spurious emissions are reduced in the first embodiment is considered as follows. In the first embodiment, the air gaps 16 are provided in the insulating layer 15. The propagation of the bulk wave propagating through the insulating layer 15 is inhibited by the air gaps 16. Therefore, the bulk wave is scattered by the unevenness of the surface 30 of the support substrate 10 and the unevenness of the surface 31 of the boundary layer 11, which results in the spurious reduction effect, and additionally, the spurious reduction effect is enhanced because the propagation of the bulk wave that cannot be fully scattered is inhibited by the air gaps 16. For this reason, it is considered that spurious emissions are reduced in the first embodiment.

The air gap 16 is located in the recess part between the protruding portions 41. For example, when the air gap 16 is located in the protruding portion 41, the air gap 16 will be located close to the piezoelectric layer 14, which may have a negative effect on the surface acoustic wave used as the primary mode. By contrast, when the air gap 16 is located in the recess part between the protruding portions 41, the air gap 16 is located away from the piezoelectric layer 14, and the influence on the surface acoustic wave used as the primary mode is reduced. For the above reason, it is considered that the main response of the first embodiment is little different from the main response of the comparative example.

In the first embodiment, as illustrated in FIG. 2, the insulating layer 15, which has the air gaps 16 located in respective recess parts of the unevenness of the surface 30, is provided between the surface 30 (an uneven surface) of the support substrate 10 and the piezoelectric layer 14. Provision of the air gaps 16 in the insulating layer 15 causes the bulk wave to be scattered by the unevenness of the surface 30, and additionally inhibits the propagation of the bulk wave that cannot be fully scattered by the air gaps 16. Therefore, spurious emissions are reduced as illustrated in FIG. 6. The influence of the air gaps 16 on the surface acoustic wave used as the primary mode is reduced by providing the air gaps 16 in the recess parts of the unevenness. Thus, the deterioration in the main response is reduced as illustrated in FIG. 6.

As illustrated in FIG. 4C, used is the wafer in which the insulating layer 15, which has the air gaps 16 located in the recess parts of the unevenness of the surface 30, is provided between the surface 30 (an uneven surface) of the support substrate 10 and the piezoelectric layer 14. The acoustic wave device having reduced deterioration in the main response and reduced spurious emissions is obtained by manufacturing the acoustic wave device using such wafers for the acoustic wave device.

As illustrated in FIG. 3D and FIG. 4A, the insulating layer 15 is formed on the surface 30 (an uneven surface) of the support substrate 10 so that the air gaps 16 located in the recess parts of the unevenness of the surface 30 are formed in the insulating layer 15 through formation of the insulating layer 15 on the surface 30 of the support substrate 10. As illustrated in FIG. 4C, the piezoelectric layer 14 is formed on the insulating layer 15. By manufacturing the acoustic wave device using such wafers for the acoustic wave device, the acoustic wave device having reduced deterioration in the main response and reduced spurious emissions is obtained. In addition, the air gaps 16 can be easily formed in the recess parts of the unevenness of the surface 30 by appropriately selecting the film forming method and/or the film forming condition of the insulating layer 15.

To inhibit the propagation of the bulk wave, the height Ha of the air gap 16 is preferably equal to or greater than 0.2 times, more preferably equal to or greater than 0.5 times, further preferably equal to or greater than 0.75 times, yet further preferably equal to or greater than 1 time the average height of the unevenness of the surface 30.

Too large width Wa of the air gap 16 decreases the effect of the unevenness of the surface 30 on scattering of the bulk wave. Thus, the width Wa of the air gap 16 is preferably equal to or less than 0.2 times, more preferably equal to or less than 0.15 times, further preferably equal to or less than 0.1 times the average period of the unevenness of the surface 30. On the other hand, too small width Wa of the air gap 16 decreases the effect of the air gaps 16 on inhibiting of the propagation of the bulk wave. Therefore, the width Wa of the air gap 16 is preferably equal to or greater than 0.01 times, more preferably equal to or greater than 0.03 times, further preferably equal to or greater than 0.05 times the average period of the unevenness of the surface 30.

As illustrated in FIG. 2, the surface 30 of the support substrate 10 has a plurality of the protruding portions 41 regularly arranged, and the regular interval Da between the air gaps 16 is substantially equal to the regular interval D1 between the protruding portions 41. This configuration allows the regular interval Da between the air gaps 16 to be the appropriate regular interval according to the wavelength of the bulk wave when the regular interval D1 between the protruding portions 41 is set to the regular interval suitable for scattering the bulk wave according to the wavelength of the bulk wave. Therefore, the propagation of the bulk wave that cannot be fully scattered by the unevenness formed of the protruding portions 41 can be effectively inhibited, thereby effectively reducing spurious emissions.

The insulating layer 15 includes the temperature compensation layer 12 (a first insulating film) mainly composed of silicon oxide, and the boundary layer 11 (a second insulating film) that is provided between the temperature compensation layer 12 and the surface 30 of the support substrate 10 and is made of a material that causes the acoustic velocity of the bulk wave propagating through the boundary layer 11 to be different from the acoustic velocity of the bulk wave propagating through the temperature compensation layer 12. This configuration reduces the temperature coefficient of frequency of the acoustic wave element 20 by the temperature compensation function of the temperature compensation layer 12, and reduces spurious emissions by the unevenness of the surface 30, which is the boundary face between the boundary layer 11 and the support substrate 10, and the air gaps 16.

As illustrated in FIG. 2, the air gap 16 preferably extends across the boundary layer 11, and extends to only a part of the temperature compensation layer 12. To reduce the temperature coefficient of frequency, the surface acoustic wave used as the primary mode propagates in the temperature compensation layer 12. Thus, by providing the air gap 16 only in a part of the temperature compensation layer 12, the influence on the surface acoustic wave used as the primary mode can be reduced, and the deterioration in the main response can be reduced. The tip of the air gap 16 is preferably located closer to the boundary layer 11 than the tip of the protruding portion 47.

When most of the energy of the surface acoustic wave exists within the section from the surface of the piezoelectric layer 14 to a depth of $2\lambda$, to confine the energy of the acoustic wave used as the primary mode within the piezoelectric layer 14 and the temperature compensation layer 12, the distance (T2+T3+T4) between a second surface, which is closer to the support substrate 10, of the temperature compensation layer 12 and a first surface, which is closer to the comb-shaped electrode 22, of the piezoelectric layer 14 is preferably equal to or less than 4 times the average value of the pitches P of the electrode fingers 23 (equal to or less than $2\lambda$), more preferably equal to or less than 3 times the average value of the pitches P of the electrode fingers 23 (equal to or less than $1.5\lambda$). The average value (the average pitch) of the pitches P of the electrode fingers 23 can be calculated by dividing the width of the IDT 21 in the X direction by the number of the electrode fingers 23.

To allow the energy of the surface acoustic wave used as the primary mode to exist within the temperature compensation layer 12, the thickness T4 of the piezoelectric layer 14 is preferably equal to or less than 2 times the average value of the pitches P of the electrode fingers 23 (equal to or less than $\lambda$), more preferably equal to or less than 1 time the average value of the pitches P of the electrode fingers 23 (equal to or less than $0.5\lambda$). When the piezoelectric layer 14 is too thin, the acoustic wave becomes less likely to be excited. Thus, the thickness T4 of the piezoelectric layer 14 is preferably equal to or greater than 0.2 times the average value of the pitches P of the electrode fingers 23 (equal to or greater than $0.1\lambda$), more preferably equal to or greater than 0.4 times the average value of the pitches P of the electrode fingers 23 (equal to or greater than $0.2\lambda$).

To allow the bulk wave to pass to the boundary layer 11, the thickness T2 of the temperature compensation layer 12 is preferably equal to or less than 1.5 times the average value of the pitches P of the electrode fingers 23 (equal to or less than $0.75\lambda$), more preferably equal to or less than 1 time the average value of the pitches P of the electrode fingers 23 (equal to or less than $0.5\lambda$). To allow the temperature compensation layer 12 to fulfill the temperature compensation function, the thickness T2 of the temperature compensation layer 12 is preferably equal to or greater than 0.2 times the average value of the pitches P of the electrode fingers 23 (equal to or greater than $0.1\lambda$), more preferably equal to or greater than 0.4 times the average value of the pitches P of the electrode fingers 23 (equal to or greater than $0.2\lambda$).

When the thickness T1 of the boundary layer 11 is small, the spurious emission increases. Thus, the thickness T1 of the boundary layer 11 is preferably equal to or greater than 0.6 times the average value of the pitches P of the electrode fingers 23 (equal to or greater than $0.3\lambda$), more preferably equal to or greater than 1.4 times the average value of the pitches P of the electrode fingers 23 (equal to or greater than $0.7\lambda$), further preferably equal to or greater than 2 times the average value of the pitches P of the electrode fingers 23 (equal to or greater than k), yet further preferably equal to or greater than 4 times the average value of the pitches P of the electrode fingers 23 (equal to or greater than $2\lambda$).

To scatter the bulk wave to reduce spurious emissions, the height H1 of the unevenness of the surface 30 of the support substrate 10 and the height H2 of the unevenness of the surface 31 of the boundary layer 11 are preferably equal to or greater than 0.2 times the average value of the pitches P of the electrode fingers 23 (equal to or greater than $0.1\lambda$), more preferably equal to or greater than 0.6 times the average value of the pitches P of the electrode fingers 23 (equal to or greater than $0.3\lambda$), further preferably equal to or greater than 1 time the average value of the pitches P of the electrode fingers 23 (equal to or greater than $0.5\lambda$). The upper limit of each of the heights H1 and H2 is, for example, $2\lambda$. Not to scatter the bulk wave by the surface 32 of the temperature compensation layer 12, the arithmetic mean roughness Ra of the surface 32 is preferably, for example, 10 nm or less, more preferably 1 nm or less.

To reduce spurious emissions, the period of the unevenness of the surface 30 (the regular interval D1 between the protruding portions 41) and the period of the unevenness of the surface 31 (the regular interval D2 between the protruding portions 47) are preferably equal to or greater than 1.6 times the average value of the pitches P of the electrode fingers 23 (equal to or greater than $0.8\lambda$), more preferably equal to or greater than 2.0 times the average value of the pitches P of the electrode fingers 23 (equal to or greater than $1.0\lambda$). To increase the main response, the period of the unevenness of each of the surfaces 30 and 31 is preferably equal to or less than 4.8 times the average value of the pitches P of the electrode fingers 23 (equal to or less than $2.4\lambda$), more preferably equal to or less than 3.2 times (equal to or less than $1.6\lambda$).

When the acoustic wave mainly excited by a pair of the comb-shaped electrodes 22 is a shear horizontal (SH) wave, the bulk wave is likely to be excited. When the piezoelectric layer 14 is a 36° or greater and 48° or less rotated Y-cut X-propagation lithium tantalate layer, the SH wave is excited. Therefore, it is preferable to provide the air gaps 16 in the insulating layer 15 in this case.

In the first embodiment, the phase of the surface 30 of the support substrate 10 may be different from the phase of the surface 31 of the boundary layer 11. The regular interval D1 between the protruding portions 41 may be different from the regular interval D2 between the protruding portions 47. The height H1 of the unevenness of the surface 30 may be different from the height H2 of the unevenness of the surface 31. The unevenness of the surface 31 of the boundary layer 11 may be irregular.

Figure 7A:
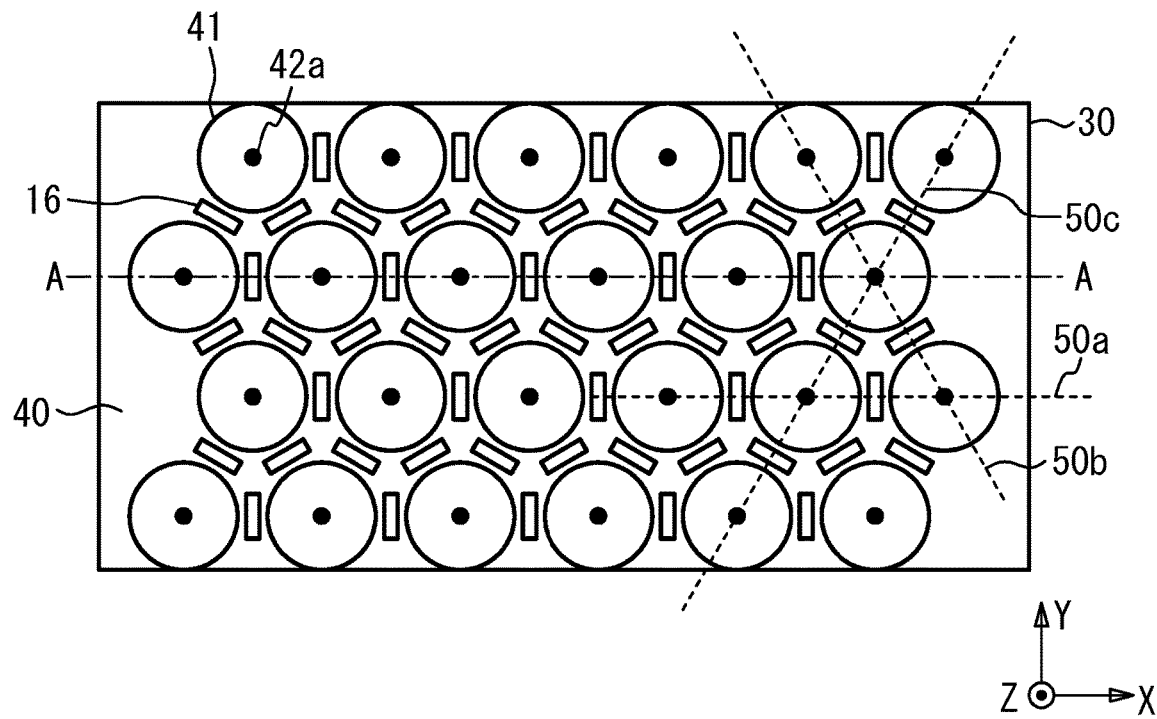
FIG. 7A is a plan view illustrating a first arrangement example of protruding portions of a support substrate in the first embodiment.
Figure 7B:
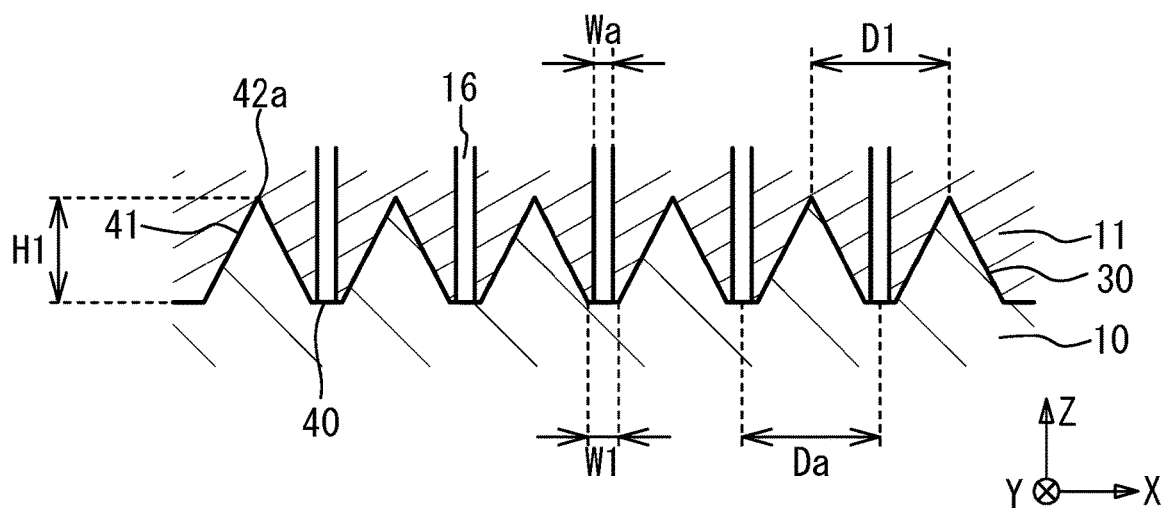
FIG. 7B is a cross-sectional view taken along line A-A in FIG. 7A.

Arrangement Examples of the Protruding Portion and the Recessed Portions of the Support Substrate FIG. 7A is a plan view illustrating a first arrangement example of the protruding portions of the support substrate in the first embodiment, and FIG. 7B is a cross-sectional view taken along line A-A in FIG. 7A. As illustrated in FIG. 7A and FIG. 7B, the surface 30 of the support substrate 10 has the protruding portions 41 arranged at regular intervals. The three-dimensional shape of the protruding portion 41 is a cone shape. A point 42a is a tip of the cone shape. The protruding portions 41 are provided on the planar surface 40. The directions in which the regular interval between the protruding portions 41 is smallest are three directions: directions 50a, 50b, and 50c. The angle between the directions 50a and 50b, the angle between the directions 50a and 50c, and the angle between the directions 50b and 50c are approximately 60°. The direction 50a is substantially parallel to the X direction. The regular interval D1 between the protruding portions 41 is substantially uniform, the distance W1 between the protruding portions 41 in each of the directions 50a to 50c is substantially uniform, and the height H1 of the protruding portion 41 is substantially uniform. The part between the protruding portions 41 may not be necessarily the planar surface 40. The air gap 16 is provided in the part where the distance between the protruding portions 41 is narrow in the recess part between the adjacent protruding portions 41. In a plan view, the air gap 16 has a substantially rectangular shape where a first direction in which the adjacent protruding portions 41 are opposite to each other is a short direction, and a second direction orthogonal to the first direction is a longitudinal direction. The regular interval Da between the air gaps 16 in each of the directions 50a to 50c is substantially uniform, and is substantially equal to the regular interval D1 between the protruding portions 41 in each of the directions 50a to 50c. The air gap 16 may have other shapes such as a substantially elliptical shape in a plan view.

Figure 8A:
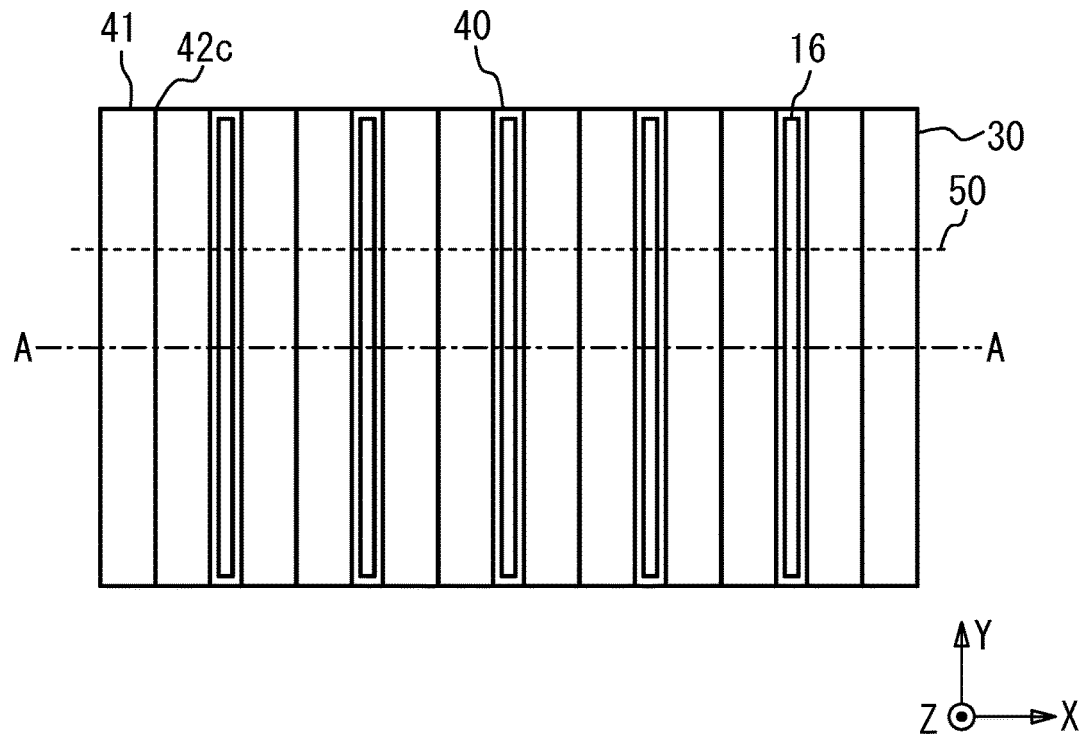
FIG. 8A is a plan view illustrating a second arrangement example of the protruding portions of the support substrate in the first embodiment.
Figure 8B:
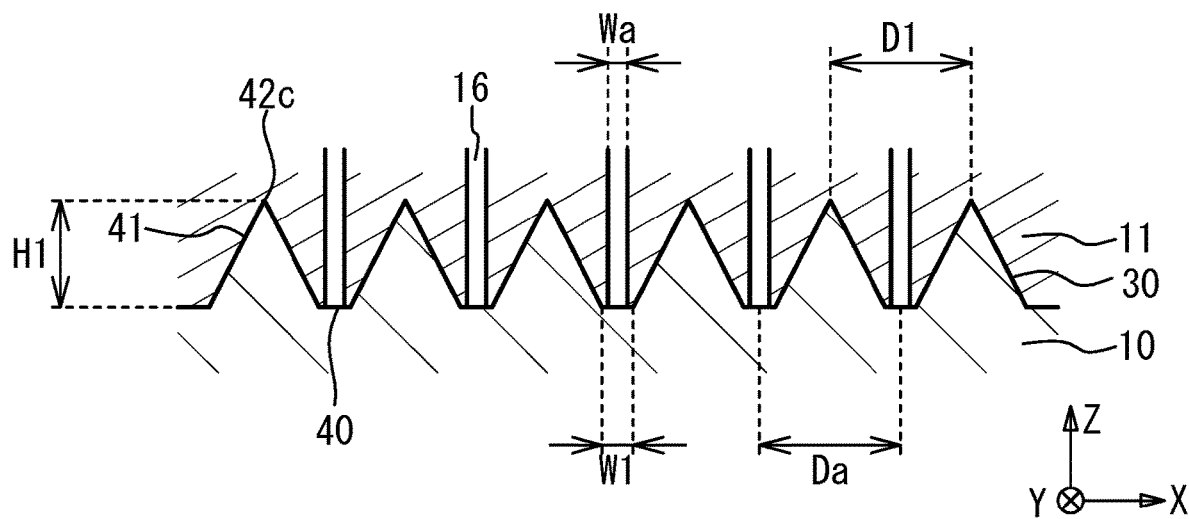
FIG. 8B is a cross-sectional view taken along line A-A in FIG. 8A.

FIG. 8A is a plan view illustrating a second arrangement example of the protruding portions of the support substrate in the first embodiment, and FIG. 8B is a cross-sectional view taken along line A-A in FIG. 8A. As illustrated in FIG. 8A and FIG. 8B, the surface 30 of the support substrate 10 has the protruding portions 41 arranged at regular intervals. The protruding portions 41 are provided on the planar surface 40. The protruding portion 41 has a line shape having a triangular cross section, or a stripe shape having a triangular cross section. A line 42c is a line connecting the vertices of the triangle in the protruding portion 41. The direction in which the regular interval between the protruding portions 41 is smallest is a direction 50, and is substantially parallel to the X direction. The regular interval D1 between the protruding portions 41 is substantially uniform, the distance W1 between the protruding portions 41 in the direction 50 is substantially uniform, and the height H1 of the protruding portion 41 is substantially uniform. The line 42c may be a straight line or a curved line. The part between the protruding portions 41 may not be necessarily the planar surface 40. The air gap 16 is provided between the protruding portions 41 adjacent to each other in the X direction, and has a substantially rectangular shape extending in the Y direction in a plan view. The regular interval Da between the air gaps 16 in the direction 50 is substantially uniform, and is substantially equal to the regular interval D1 between the protruding portions 41 in the direction 50. The air gap 16 may have other shapes such as substantially elliptical shape in a plan view.

As illustrated in FIG. 7A and FIG. 8A, the air gap 16 preferably has a strip shape having a longitudinal direction and a short direction in a plan view. This allows the propagation of the bulk wave to be more likely to be inhibited by the air gaps 16, thereby reducing spurious emissions effectively. The ratio of the length of the air gap 16 in the longitudinal direction to the length of the air gap 16 in the short direction (the length in the longitudinal direction/the length in the short direction) is preferably 5 or greater, more preferably 7 or greater, further preferably 10 or greater. To inhibit the propagation of the bulk wave, the air gap 16 preferably has a strip shape having the longitudinal direction in the direction intersecting with the X direction (e.g., the direction orthogonal to the X direction) in a plan view.

Figure 9A:
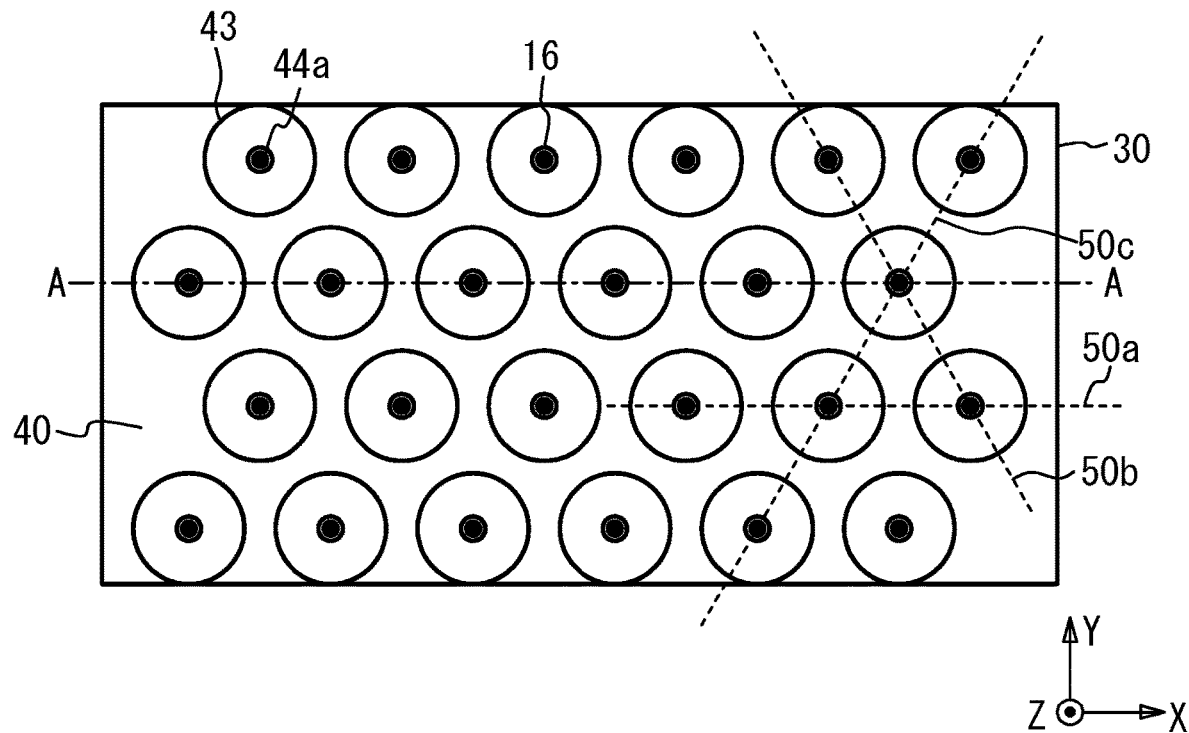
FIG. 9A is a plan view illustrating a first arrangement example of recessed portions of the support substrate in the first embodiment.
Figure 9B:
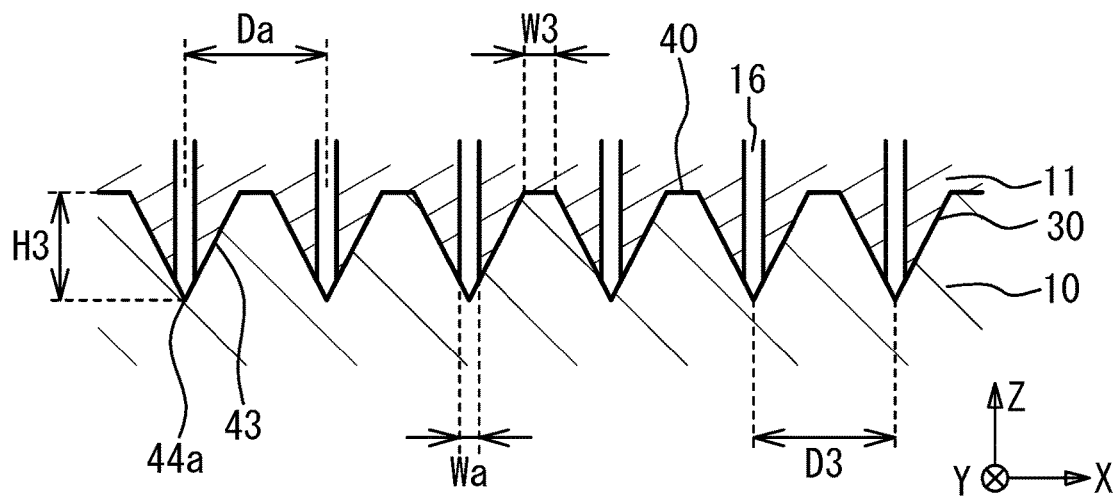
FIG. 9B is a cross-sectional view taken along line A-A in FIG. 9A.

In FIG. 7A to FIG. 8B, the surface 30 of the support substrate 10 is an uneven surface formed by the formation of a plurality of the protruding portions 41, but may be an uneven surface formed by the formation of a plurality of recessed portions. FIG. 9A is a plan view illustrating a first arrangement example of the recessed portions of the support substrate in the first embodiment, and FIG. 9B is a cross-sectional view taken along line A-A in FIG. 9A. As illustrated in FIG. 9A and FIG. 9B, the surface 30 of the support substrate 10 has recessed portions 43 arranged at regular intervals. The three-dimensional shape of the recessed portion 43 is a cone shape. A point 44a is a tip of the cone shape. The recessed portions 43 are provided on the planar surface 40. The directions in which the regular interval between the recessed portions 43 is smallest are three directions: the directions 50a, 50b, and 50c. The angle between the directions 50a and 50b, the angle between the directions 50b and 50c, and the angle between the directions 50a and 50c are approximately 60°. The direction 50a is substantially parallel to the X direction. The regular interval D3 between the recessed portions 43 is substantially uniform, the distance W3 between the recessed portions 43 in each of the directions 50a to 50c is substantially uniform, and the depth H3 of the recessed portion 43 is substantially uniform. The part between the recessed portions 43 may not be necessarily the planar surface 40. The air gaps 16 are located in the respective recessed portions 43, and have a substantially circular shape in a plan view. The regular interval Da between the air gaps 16 in each of the directions 50a to 50c is substantially uniform, and is substantially equal to the regular interval D3 between the recessed portions 43 in each of the directions 50a to 50c. The air gap 16 may have other shapes such as a substantially square shape in a plan view.

Figure 10A:
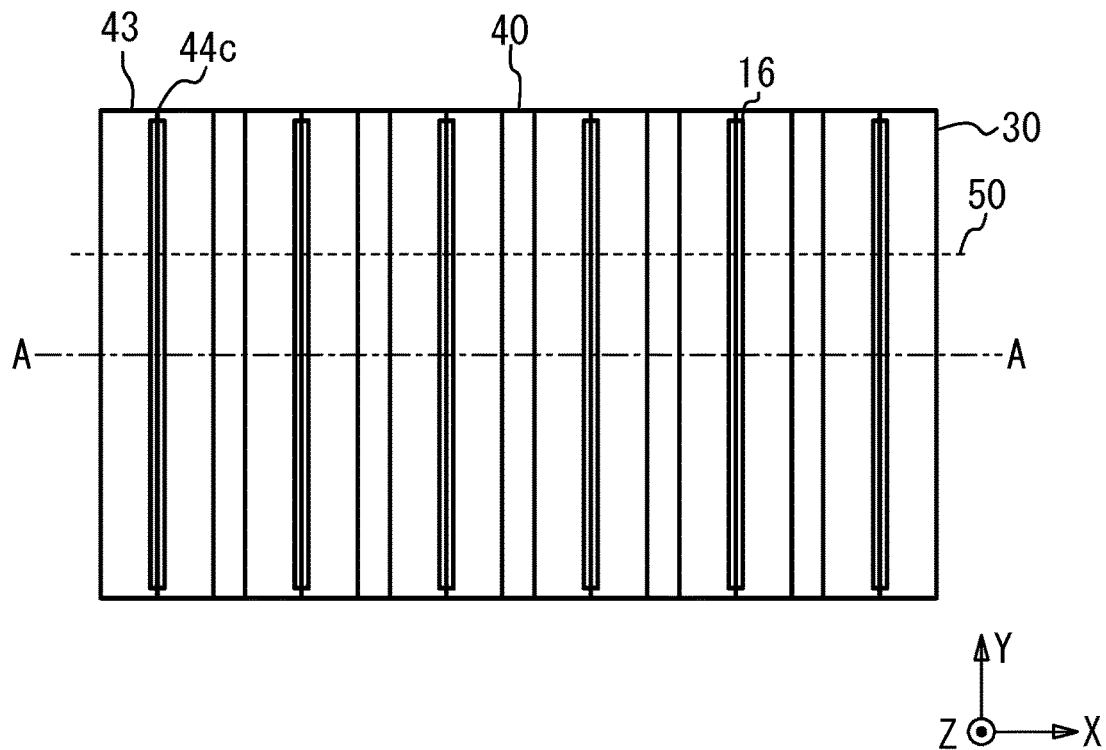
FIG. 10A is a plan view illustrating a second arrangement example of the recessed portions of the support substrate in the first embodiment.
Figure 10B:
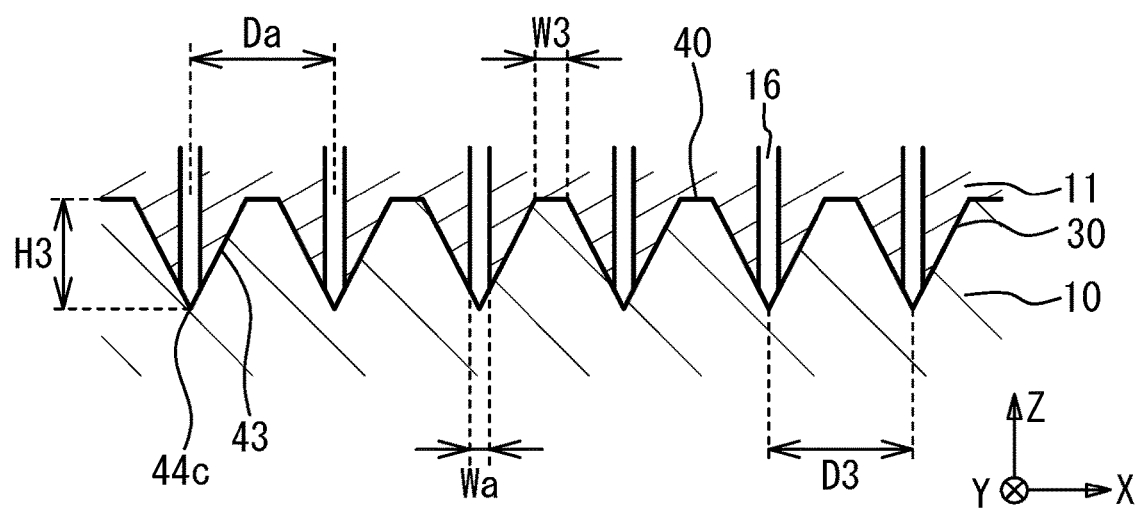
FIG. 10B is a cross-sectional view taken along line A-A in FIG. 10A.

FIG. 10A is a plan view illustrating a second arrangement example of the recessed portions of the support substrate in the first embodiment, and FIG. 10B is a cross-sectional view taken along line A-A in FIG. 10A. As illustrated in FIG. 10A and FIG. 10B, the surface 30 of the support substrate 10 has the recessed portions 43 arranged at regular intervals. The recessed portions 43 are provided on the planar surface 40. The recessed portion 43 has a line shape having a triangular cross section or a stripe shape having a triangular cross section. A line 44c is a line connecting vertices of the triangle in the recessed portion 43. The direction in which the regular interval between the recessed portions 43 is smallest is the direction 50, and is substantially parallel to the X direction. The regular interval D3 between the recessed portions 43 is substantially uniform, the distance W3 between the recessed portions 43 in the direction 50 is substantially uniform, and the depth H3 of the recessed portion 43 is substantially uniform. The line 44c may be a straight line or a curved line. The part between the recessed portions 43 may not be necessarily the planar surface 40. The air gap 16 is provided in the recessed portion 43, and has a substantially rectangular shape extending in the Y direction in a plan view. The regular interval Da between the air gaps 16 in the direction 50 is substantially uniform, and is substantially equal to the regular interval D3 between the recessed portions 43 in the direction 50. The air gap 16 may have other shapes such as a substantially elliptical shape in a plan view.

When the recessed portions 43 form the uneven surface of the surface 30, the average height of the unevenness of the surface 30 may be the average value of the depths H3 of all the recessed portions 43, or may be the average of the depths H3 of ¼ or ⅙ of all the recessed portions 43. The average value may be the arithmetic average. Alternatively, the average height of the unevenness of the surface 30 may be obtained as follows. The cross-section of the acoustic wave device is observed, and the depths H3 of several (for example, about five) recessed portions 43 located next to the air gaps 16 are measured. The arithmetic average of the measured depths H3 may be defined as the average height of the surface 30. The average period of the unevenness of the surface 30 may be the average value of the regular intervals D3 between respective two of all the recessed portions 43, or may be the average value of the regular intervals D3 between respective two of ½ or ⅓ of all the recessed portions 43. The average value may be the arithmetic average. Alternatively, the average period of the unevenness of the surface 30 may be obtained as follows. The cross-section of the acoustic wave device is observed, and the regular intervals D3 between respective two of several (for example, about five) recessed portions 43 located next to the air gaps 16 are measured. The average of the measured regular intervals may be used as the average period of the unevenness of the surface 30.

As illustrated in FIG. 9A to FIG. 10B, the surface 30 of the support substrate 10 may have the recessed portions 43 regularly arranged, and the regular interval Da between the air gaps 16 may be substantially equal to the regular interval D3 between the recessed portions 43. This configuration allows the regular interval Da between the air gaps 16 to be an appropriate regular interval according to the wavelength of the bulk wave when the regular interval D3 between the recessed portions 43 is set to the interval suitable for scattering the bulk wave according to the wavelength of the bulk wave. Therefore, the propagation of the bulk wave that cannot be fully scattered by the unevenness formed of the recessed portions 43 can be effectively inhibited by the air gaps 16, and thereby, spurious emissions can be effectively reduced.

When the surface 30 of the support substrate 10 has the protruding portions 41 and/or the recessed portions 43 regularly arranged, the uniformity of the characteristics such as the magnitude of the spurious emission can be increased.

Figure 11A:
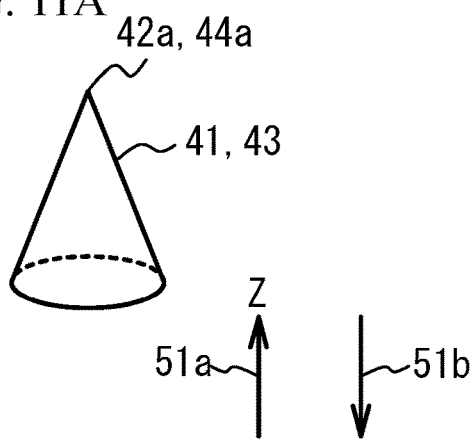
FIG. 11A to FIG. 11P illustrate three-dimensional shapes of the protruding portion and the recessed portion of the support substrate in the first embodiment.
Figure 11B:
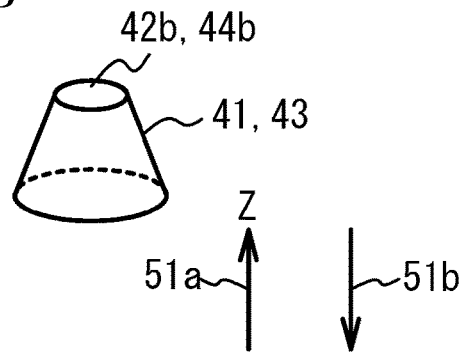
Figure 11C:
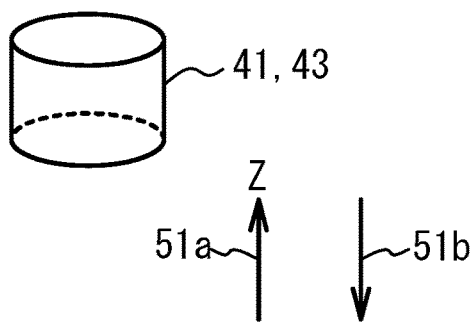
Figure 11D:
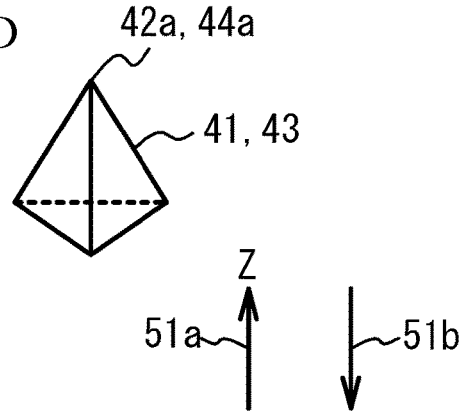
Figure 11E:
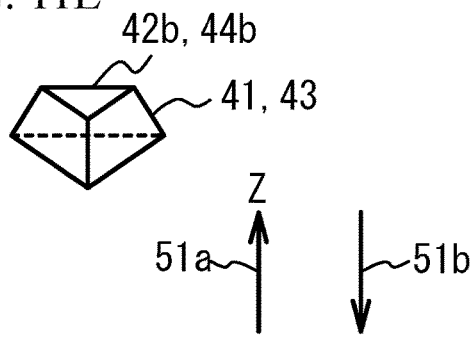
Figure 11F:
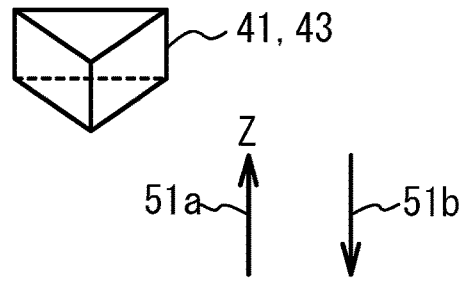
Figure 11G:
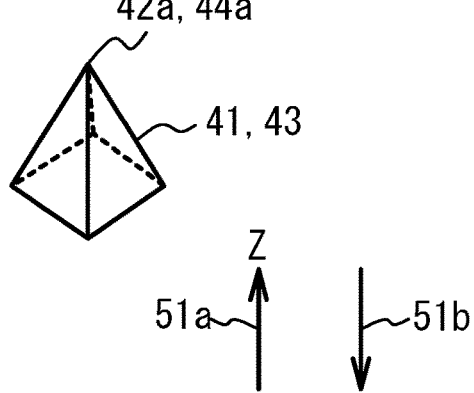
Figure 11H:
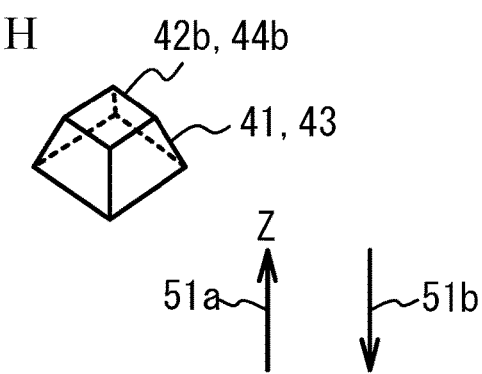
Figure 11I:
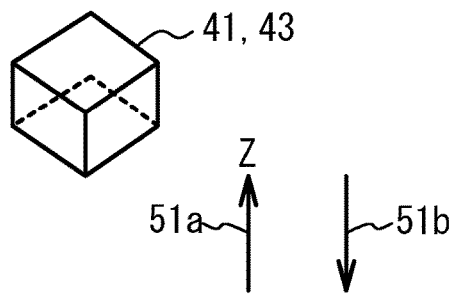
Figure 11J:
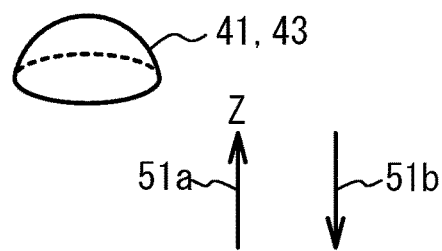
Figure 11K:
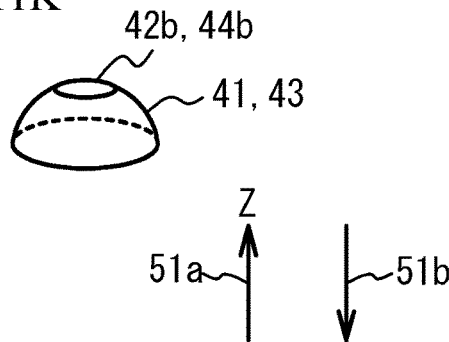
Figure 11L:
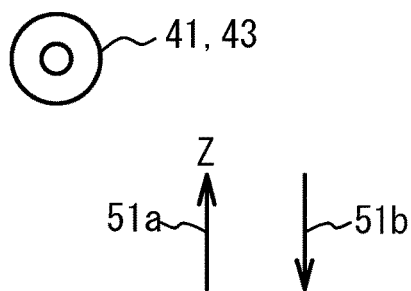
Figure 11M:
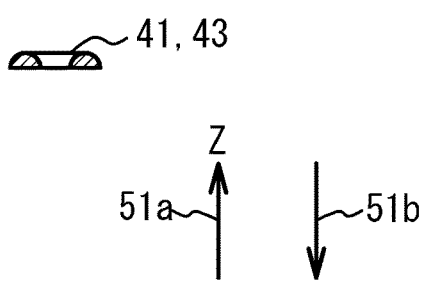
Figure 11N:
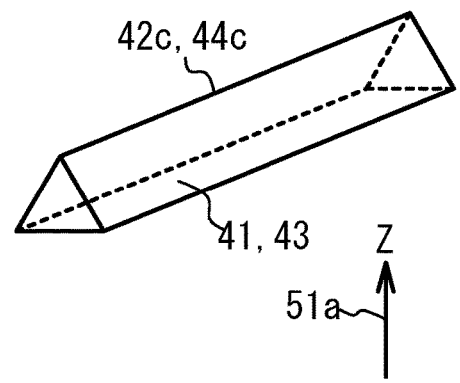
Figure 11O:
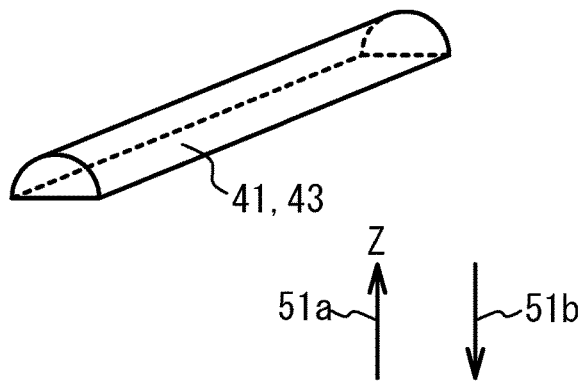
Figure 11P:
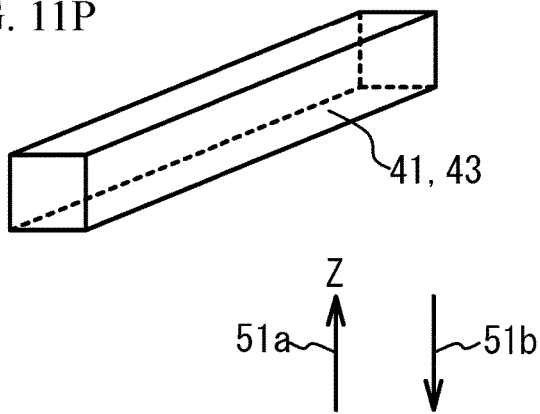

Three-dimensional Shapes of the Protruding Portion and the Recessed Portion of the Support Substrate FIG. 11A to FIG. 11P are diagrams illustrating three-dimensional shapes of the protruding portion and the recessed portion of the support substrate in the first embodiment. FIG. 11A to FIG. 11K and FIG. 11N to FIG. 11P are perspective views. When the protruding portion 41 is illustrated, the upward direction is the +Z direction as indicated by an arrow 51a. When the recessed portion 43 is illustrated, the upward direction is the −Z direction as indicated by an arrow 51b. FIG. 11L is a plan view, and FIG. 11M is a cross-sectional view. In FIG. 11A to FIG. 11M, the protruding portion 41 and the recessed portion 43 are island-shaped or dot-shaped. In FIG. 11N to FIG. 11P, the protruding portion 41 and the recessed portion 43 are line-shaped or stripe-shaped.

As illustrated in FIG. 11A, the protruding portion 41 may have a cone shape having the tip 42a, and the recessed portion 43 may have a cone shape having the tip 44a. As illustrated in FIG. 11B, the protruding portion 41 may have a circular truncated cone shape having an upper surface 42b, and the recessed portion 43 may have a circular truncated cone shape having a lower surface 44b. As illustrated in FIG. 11C, the protruding portion 41 and the recessed portion 43 may have a circular cylindrical shape.

As illustrated in FIG. 11D, the protruding portion 41 may have a trigonal pyramid shape having the tip 42a, and the recessed portion 43 may have a trigonal pyramid shape having the tip 44a. As illustrated in FIG. 11E, the protruding portion 41 may have a truncated trigonal pyramid shape having the upper surface 42b, and the recessed portion 43 may have a truncated trigonal pyramid shape having the lower surface 44b. As illustrated in FIG. 11F, the protruding portion 41 and the recessed portion 43 may have a triangular prism shape.

As illustrated in FIG. 11G, the protruding portion 41 may have a quadrangular pyramid shape having the tip 42a, and the recessed portion 43 may have a quadrangular pyramid shape having the tip 44a. As illustrated in FIG. 11H, the protruding portion 41 may have a truncated quadrangular pyramid shape having the upper surface 42b, and the recessed portion 43 may have a truncated quadrangular pyramid shape having the lower surface 44b. As illustrated in FIG. 11I, the protruding portion 41 and the recessed portion 43 may have a quadrangular prism shape. As described above, the three-dimensional shapes of the protruding portion 41 and the recessed portion 43 may be a cone shape, a polygonal pyramid shape, a truncated cone shape, a truncated polygonal pyramid shape, a cylindrical shape, or a prism shape.

As illustrated in FIG. 11J, the protruding portion 41 and the recessed portion 43 may have a hemispheric shape. As illustrated in FIG. 11K, the protruding portion 41 may have a shape obtained by removing the upper part of the hemisphere along the upper surface 42b, and the recessed portion 43 may have a shape obtained by removing the lower part of the hemisphere along the lower surface 44b. As described above, the three-dimensional shapes of the protruding portion 41 and the recessed portion 43 may be a part of a sphere shape.

As illustrated in FIG. 11L and FIG. 11M, the protruding portion 41 and the recessed portion 43 may have a shape formed of a part of a donut shape.

As illustrated in FIG. 11N, the protruding portion 41 and the recessed portion 43 may have a line shape having a triangular cross section. As illustrated in FIG. 11O, the protruding portion 41 and the recessed portion 43 may have a line shape having a semicircular cross section. As illustrated in FIG. 11P, the protruding portion 41 and the recessed portion 43 may have a line shape having a quadrangular cross section. The protruding portion 41 and the recessed portion 43 may linearly extend, or may extend in a curved line.

Second Embodiment

Figure 12:
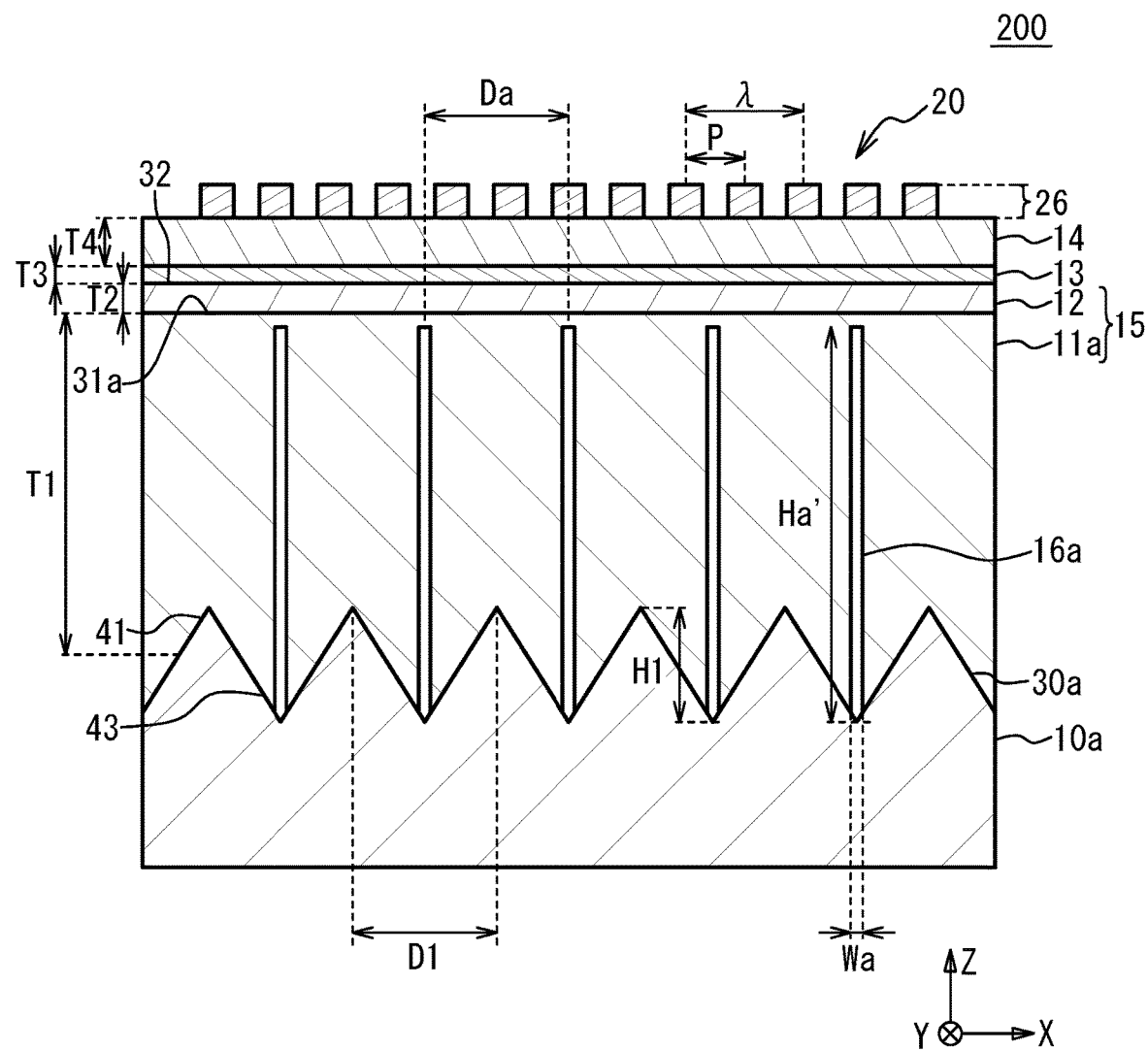
FIG. 12 is a cross-sectional view of an acoustic wave device in accordance with a second embodiment.

FIG. 12 is a cross-sectional view of an acoustic wave device in accordance with a second embodiment. As illustrated in FIG. 12, in an acoustic wave device 200 of the second embodiment, a surface 30a of a support substrate 10a is an uneven surface formed of the protruding portions 41 and the recessed portions 43 regularly arranged. A boundary layer 11a provided on the surface 30a of the support substrate 10a is thicker than the boundary layer 11 of the first embodiment. The thickness of the boundary layer 11a is, for example, equal to or greater than 10 times the average height of the unevenness of the surface 30a and equal to or less than 60 times the average height of the unevenness of the surface 30a, and is, for example, from 5 μm to 30 μm, for example, from 3λ to 20λ. The thickness of the boundary layer 11a may be equal to or less than 30 times the average height of the unevenness of the surface 30a, for example. A surface 31a of the boundary layer 11a is a flat surface. Air gaps 16a are provided in the boundary layer 11a so as to extend in the Z direction, but do not extend to the temperature compensation layer 12. The height Ha' of the air gap 16a is, for example, from 3λ to 10λ. Other structures are the same as those of the first embodiment, and the description thereof is thus omitted Experiment An experiment for evaluating spurious emissions was conducted for the acoustic wave device 200 in accordance with the second embodiment. The experiment conditions are as follows. In the experiment, a sample where the distance W1 is formed between the protruding portions 41 as in the first embodiment was used.

Wavelength λ of the acoustic wave: 2 μm
Support substrate 10: Sapphire substrate
Boundary layer 11a: Aluminum oxide layer with a thickness T1 of 6.0λ
Temperature compensation layer 12: Silicon oxide layer with a thickness T2 of 0.2λ
Bonding layer 13: not provided
Piezoelectric layer 14: Rotated Y-cut X-propagation lithium tantalate layer with a thickness T4 of 0.4λ
Metal film 26: Aluminum film with a thickness of 0.1λ
Height H1 of the unevenness: 0.35λ
Regular interval D1 between the protruding portions 41: 0.8λ
Distance W1 between the protruding portions 41: 0.05λ
Height Ha' of the air gap 16a: 6.25λ
Width Wa of the air gap 16: 0.025λ
Regular interval Da between the air gaps 16: 0.8λ

Figure 13:
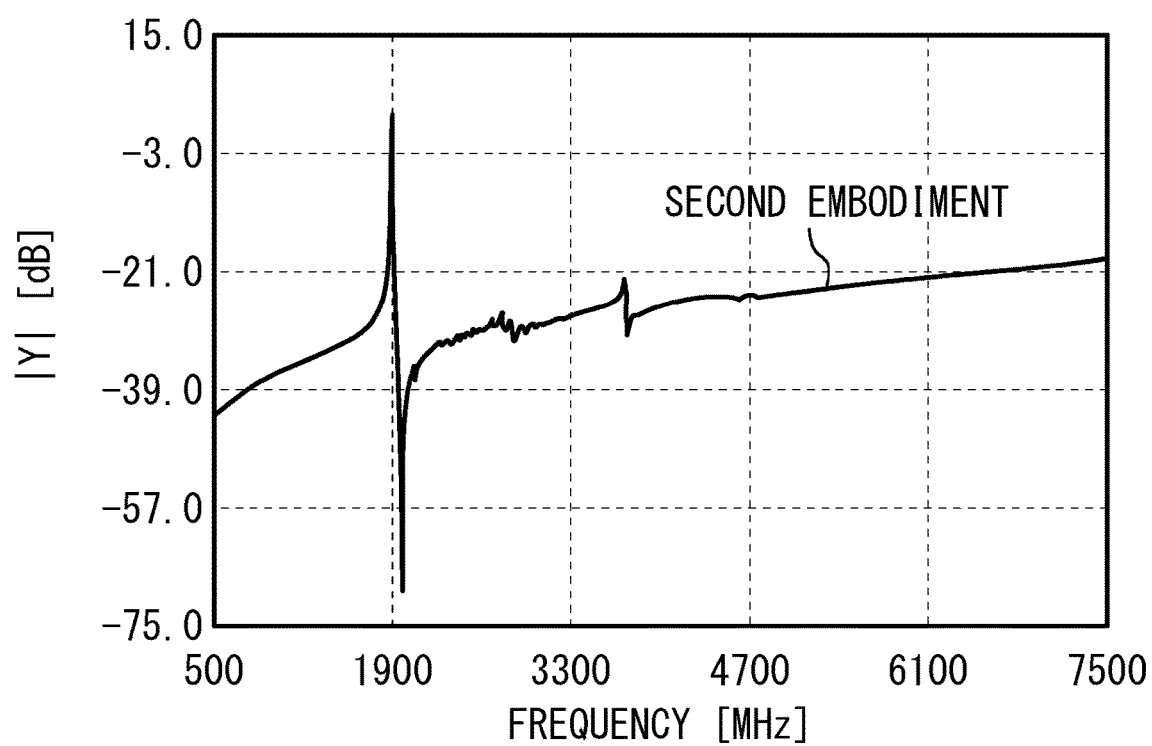
FIG. 13 is a graph of admittance |Y| versus frequency in the acoustic wave device in accordance with the second embodiment.

FIG. 13 is a graph of admittance |Y| versus frequency in the acoustic wave device of the second embodiment. As illustrated in FIG. 13, in the acoustic wave device 200 of the second embodiment, the spurious response is reduced while the deterioration in the main response formed by the surface acoustic wave used as the primary mode is reduced.

In the second embodiment, the surface 31a of the boundary layer 11a is a flat surface. Even in such a case, the deterioration in the main response is reduced and spurious emissions are reduced by providing, in the insulating layer 15, the air gaps 16a located in the respective recessed portions 43.

As in the second embodiment, it is preferable that the air gap 16a is provided only in the boundary layer 11a among the temperature compensation layer 12 and the boundary layer 11a, and does not extend to the temperature compensation layer 12. To reduce the temperature coefficient of frequency, the surface acoustic wave used as the primary mode propagates in the temperature compensation layer 12. Thus, the influence on the surface acoustic wave used as the primary mode is reduced by not forming the air gaps 16a in the temperature compensation layer 12, and thereby, the deterioration in the main response can be reduced.

To inhibit the propagation of the bulk wave in the boundary layer 11a by the air gaps 16a, the air gaps 16a are preferably provided in the boundary layer 11a while having a length equal to or greater than 0.5 times the thickness T1 of the boundary layer 11a in the thickness direction of the boundary layer 11a, are more preferably provided in the boundary layer 11a while having a length equal to or greater than 0.6 times the thickness T1 of the boundary layer 11a in the thickness direction of the boundary layer 11a, are further preferably provided in the boundary layer 11a while having a length equal to or greater than 0.7 times the thickness T1 of the boundary layer 11a in the thickness direction of the boundary layer 11a, and are yet further preferably provided in the boundary layer 11a while having a length equal to or greater than 0.8 times the thickness T1 of the boundary layer 11a in the thickness direction of the boundary layer 11a.

Third Embodiment

Figure 14:
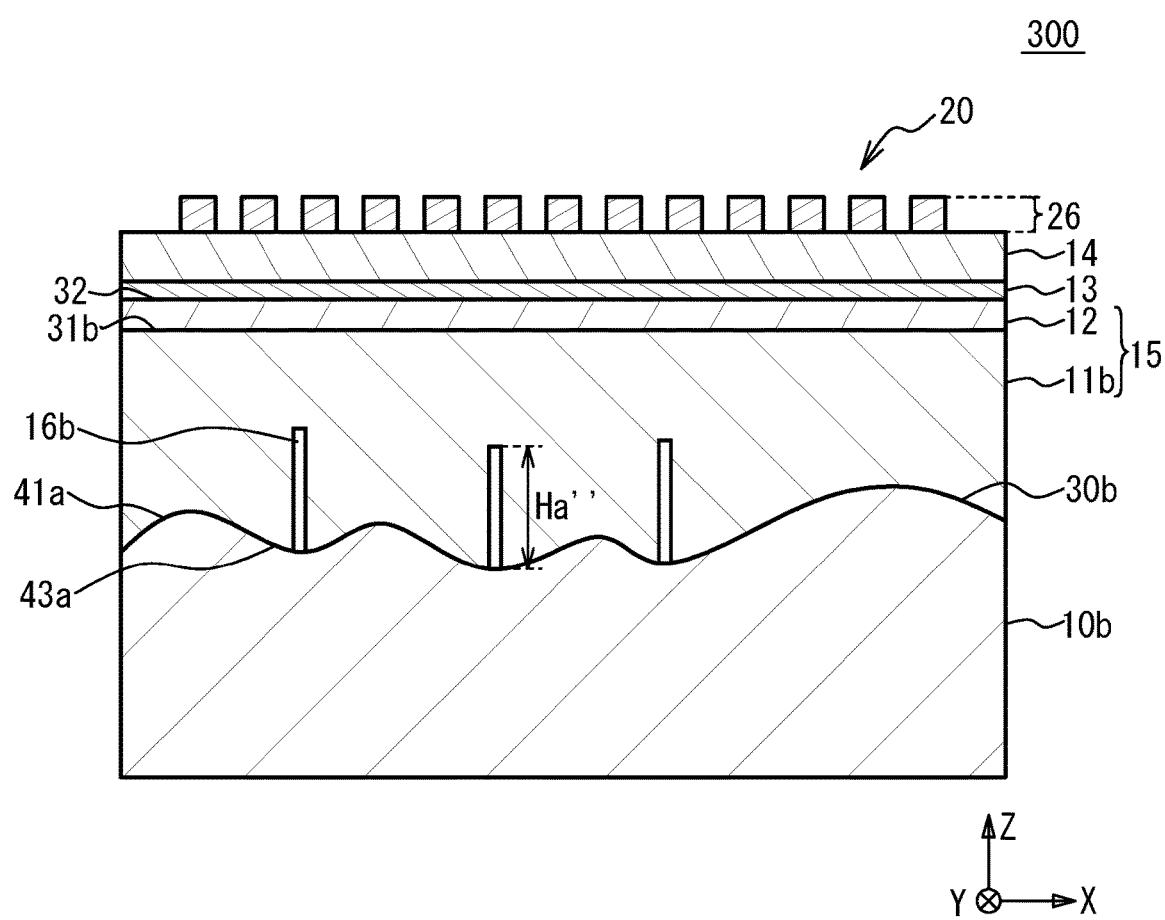
FIG. 14 is a cross-sectional view of an acoustic wave device in accordance with a third embodiment.

FIG. 14 is a cross-sectional view of an acoustic wave device in accordance with a third embodiment. As illustrated in FIG. 14, in an acoustic wave device 300 of the third embodiment, a surface 30b of a support substrate 10b is an uneven surface having irregular unevenness where protruding portions 41a and recessed portions 43a are irregularly arranged. The unevenness of the surface 30b is formed by, for example, lapping. The arithmetic mean roughness Ra of the surface 30b is, for example, 0.1 μm or greater, for example, from 0.1 μm to 0.5 μm. When the surface 30b is an irregularly uneven surface, the average height of the unevenness of the surface 30b may be the arithmetic mean roughness Ra, and the average period of the unevenness of the surface 30b may be the average value (the arithmetic average) of the intervals between respective two of 5 or 10 adjacent protruding portions 41a or 5 or 10 adjacent recessed portions 43a. A boundary layer 11b provided on the surface 30b of the support substrate 10b is thicker than the boundary layer 11 in the first embodiment. The thickness of the boundary layer 11b is, for example, from 5 μm to 30 for example, from 3λ to 20λ. A surface 31b of the boundary layer 11b is a flat surface. Air gaps 16b are provided in the boundary layer 11b so as to extend in the Z direction, but do not extend to the temperature compensation layer 12. The height Ha" of the air gap 16b is, for example, from 0.5λ to 20λ. Other structures are the same as those of the first embodiment, and the description thereof is thus omitted.

In the third embodiment, the surface 30b of the support substrate 10b is an uneven surface having irregular unevenness. Even in this case, the deterioration in the main response can be reduced and spurious emissions are reduced by providing, in the insulating layer 15, the air gaps 16b located in the respective recessed portions 43a.

In the third embodiment, as in the second embodiment, the air gaps 16b are provided only in the boundary layer 11b. Thus, the influence of the air gap 16b on the surface acoustic wave used as the primary mode can be reduced, and the deterioration in the main resonance can be reduced.

In the first to third embodiments, the unevenness provided to the respective surfaces 30 to 30b of the support substrates 10 to 10b may be provided across the entire surfaces 30 to 30b, or provided only in the region overlapping with the acoustic wave element 20 of the surfaces 30 to 30b. When the unevenness is provided only in the region overlapping with the acoustic wave element 20, the influence of the unevenness on dicing or cleaving for separating the wafer into individual chips at the end of the manufacturing process is removed.

In the first to third embodiments, the acoustic wave excited by a pair of the comb-shaped electrodes 22 is not limited to the surface acoustic wave, and may be a Love wave or a boundary acoustic wave. In addition, the acoustic wave element 20 may be a piezoelectric thin film resonator.

Fourth Embodiment

Figure 15:
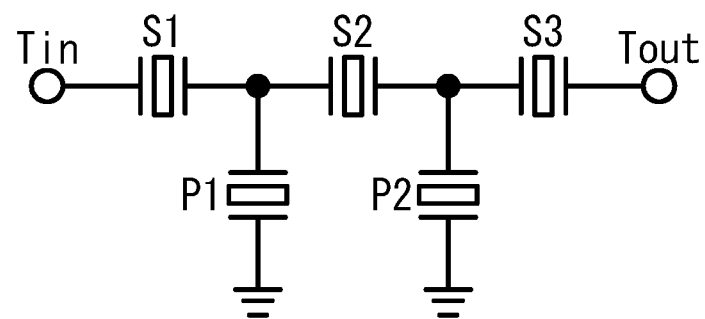
FIG. 15 is a circuit diagram of a filter in accordance with a fourth embodiment.

FIG. 15 is a circuit diagram of a filter in accordance with a fourth embodiment. As illustrated in FIG. 15, a filter 400 includes one or more series resonators S1 to S3 connected in series between an input terminal Tin and an output terminal Tout, and one or more parallel resonators P1 and P2 connected in parallel between the input terminal Tin and the output terminal Tout. The acoustic wave device according to any one of the first to third embodiments may be used as at least one of the following resonators: one or more series resonators S1 to S3 and one or more parallel resonators P1 and P2. The number of resonators of the ladder-type filter can be freely selected. The filter may be a multimode type filter.

Fifth Embodiment

Figure 16:
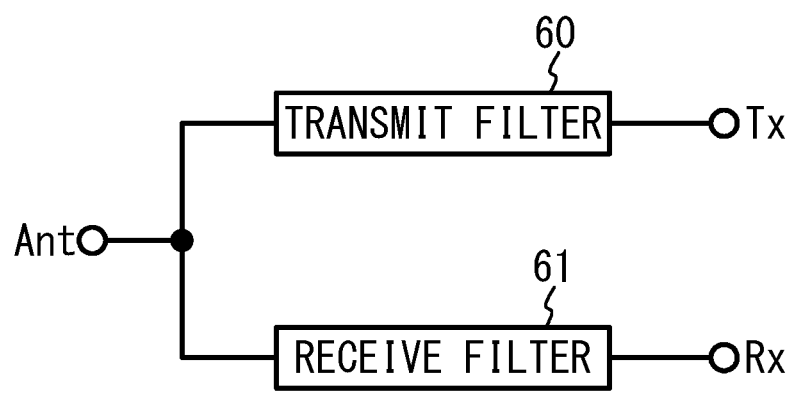
FIG. 16 is a circuit diagram of a duplexer in accordance with a fifth embodiment.

FIG. 16 is a circuit diagram of a duplexer in accordance with a fifth embodiment. As illustrated in FIG. 16, a duplexer 500 includes a transmit filter 60 connected between a common terminal Ant and a transmit terminal Tx, and a receive filter 61 connected between the common terminal Ant and a receive terminal Rx. The transmit filter 60 transmits, as transmission signals, signals in the transmit band to the common terminal Ant among high-frequency signals input from the transmit terminal Tx, and suppresses signals with other frequencies. The receive filter 61 transmits, as reception signals, signals in the receive band to the receive terminal Rx among high-frequency signals input from the common terminal Ant, and suppresses signals with other frequencies. The transmit filter 60, the receive filter 61, or the transmit filter 60 and the receive filter 61 may be the filter of the fourth embodiment.

The duplexer has been described as an example of the multiplexer, but the multiplexer may be a triplexer or a quadplexer.

Although the embodiments of the present invention have been described in detail, the present invention is not limited to such a specific embodiment, and it is to be understood that the various change, substitutions, and alterations could be made hereto without departing from the spirit and scope of the invention.

What is claimed is:

1. An acoustic wave device comprising:
   a support substrate having an uneven surface;
   a piezoelectric layer provided on the uneven surface of the support substrate;
   an electrode that excites an acoustic wave in the piezoelectric layer; and
   an insulating layer that is provided between the uneven surface of the support substrate and the piezoelectric layer, and has an air gap located in a recess part of the uneven surface, an upper portion of the air gap being covered with the insulating layer and a side portion of the air gap being surrounded by the insulating layer.

2. The acoustic wave device according to claim 1, wherein a height of the air gap is equal to or greater than 0.2 times an average height of unevenness of the uneven surface.

3. The acoustic wave device according to claim 1, wherein a width of the air gap is equal to or greater than 0.01 times an average period of unevenness of the uneven surface and equal to or less than 0.2 times the average period of the unevenness of the uneven surface, the width being a largest length in a short direction when the air gap is viewed in a plan view.

4. The acoustic wave device according to claim 1,
   wherein the uneven surface has protruding portions regularly arranged, and
   wherein the air gap is provided in plural, and a regular interval between each air gap is substantially equal to a regular interval between the protruding portions.

5. The acoustic wave device according to claim 1,
   wherein the uneven surface has recessed portions regularly arranged, and
   wherein the air gap is provided in plural, and a regular interval between each air gap is substantially equal to a regular interval between the recessed portions.

6. The acoustic wave device according to claim 1, wherein the insulating layer includes a first insulating film mainly composed of silicon oxide, and a second insulating film provided between the first insulating film and the uneven surface of the support substrate, the second insulating film being composed of a material that causes an acoustic velocity of a bulk wave propagating through the second insulating film to be different from an acoustic velocity of a bulk wave propagating through the first insulating film.

7. The acoustic wave device according to claim 6, wherein the air gap is provided so as to extend across the second insulating film, and extend to only a part of the first insulating film.

8. The acoustic wave device according to claim 6, wherein the air gap is provided only in the second insulating film of the first and second insulating films.

9. The acoustic wave device according to claim 8, wherein the air gap is provided in the second insulating film while having a length equal to or greater than 0.5 times a thickness of the second insulating film in a thickness direction of the second insulating film.

10. The acoustic wave device according to claim 1, wherein the electrode is a pair of comb-shaped electrodes that is disposed on a surface of the piezoelectric layer opposite to the support substrate and includes a plurality of electrode fingers.

11. A wafer comprising:
    a support substrate having an uneven surface;
    a piezoelectric layer provided on the uneven surface of the support substrate; and
    an insulating layer that is provided between the uneven surface of the support substrate and the piezoelectric layer, and has an air gap located in a recess part of the uneven surface, an upper portion of the air gap being covered with the insulating layer and a side portion of the air gap being surrounded by the insulating layer.

12. The acoustic wave device according to claim 1, wherein a height of the air gap is greater than a width of the air gap, the width being a largest length in a short direction when the air gap is viewed in a pian view.

13. The acoustic wave device according to claim 1, wherein the upper portion and the side portion of the air gap are in contact with the insulating layer.

* * * * *